(12) United States Patent
Takasawa et al.

(10) Patent No.: US 9,758,623 B2
(45) Date of Patent: Sep. 12, 2017

(54) POLYIMIDE PRECURSOR AND POLYIMIDE

(71) Applicant: Ube Industries, Ltd., Ube-shi (JP)

(72) Inventors: Ryoichi Takasawa, Ube (JP); Takuya Oka, Ube (JP); Yukinori Kohama, Ube (JP); Miharu Nakagawa, Ube (JP); Keiji Iwamoto, Ube (JP); Kenji Hirotsu, Ube (JP); Yoshiyuki Watanabe, Ube (JP)

(73) Assignee: UBE INDUSTRIES, LTD., Ube-Shi (JP)

( * ) Notice: Subject to any disclaimer, the term of this patent is extended or adjusted under 35 U.S.C. 154(b) by 6 days.

(21) Appl. No.: 14/821,380

(22) Filed: Aug. 7, 2015

(65) Prior Publication Data

US 2016/0032056 A1 Feb. 4, 2016

Related U.S. Application Data

(63) Continuation of application No. 14/004,362, filed as application No. PCT/JP2012/056310 on Mar. 12, 2012, now abandoned.

(30) Foreign Application Priority Data

| Mar. 11, 2011 | (JP) | 2011-054845 |
| Mar. 31, 2011 | (JP) | 2011-079396 |
| Jan. 20, 2012 | (JP) | 2012-010529 |
| Jan. 20, 2012 | (JP) | 2012-010540 |

(51) Int. Cl.

| C09D 179/08 | (2006.01) |
| C08G 73/10 | (2006.01) |
| H01M 14/00 | (2006.01) |
| C08G 73/14 | (2006.01) |
| C08G 69/00 | (2006.01) |
| C08G 73/06 | (2006.01) |
| H01L 31/0392 | (2006.01) |
| B05D 1/30 | (2006.01) |

(Continued)

(52) U.S. Cl.
CPC ........... *C08G 73/1085* (2013.01); *B05D 1/30* (2013.01); *B05D 3/0254* (2013.01); *B05D 3/0413* (2013.01); *B29C 39/02* (2013.01); *B29C 39/22* (2013.01); *C08G 69/00* (2013.01); *C08G 73/0644* (2013.01); *C08G 73/1078* (2013.01); *C08G 73/14* (2013.01); *C08J 5/18* (2013.01); *C09D 179/08* (2013.01); *H01L 31/03926* (2013.01); *H01M 14/005* (2013.01); *B29K 2079/08* (2013.01); *B29K 2995/0012* (2013.01); *B29K 2995/0016* (2013.01); *B29K 2995/0026* (2013.01); *B29K 2995/0037* (2013.01); *B29K 2995/0082* (2013.01); *B29L 2031/34* (2013.01); *C08J 2379/08* (2013.01); *Y02E 10/50* (2013.01)

(58) Field of Classification Search
CPC ... C08G 73/1078; C08G 73/14; C09D 179/08
USPC .......................... 524/600, 726, 879; 528/327
See application file for complete search history.

(56) References Cited

U.S. PATENT DOCUMENTS

| 6,740,371 B1 | 5/2004 | Hosaka et al. |
| 2002/0098378 A1 | 7/2002 | Kim et al. |

(Continued)

FOREIGN PATENT DOCUMENTS

| CN | 101831175 A | 9/2010 |
| JP | A-H01-214822 | 8/1989 |

(Continued)

OTHER PUBLICATIONS

Kusama, Masotoshi et al., "Soluble Polymides with Polyalicyclic Structure," Macromolecules, vol. 27, No. 5, 1994, pp. 1117-1123.

(Continued)

*Primary Examiner* — Edward Cain
(74) *Attorney, Agent, or Firm* — Knobbe Martens Olson & Bear LLP

(57) ABSTRACT

The present invention relates to a polyimide precursor comprising a repeating unit represented by the following chemical formula (1):

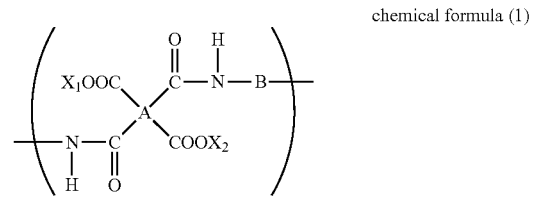

chemical formula (1)

wherein A is a tetravalent group having at least one aliphatic six membered ring and no aromatic ring in the chemical structure, and B is a divalent group having at least one amide bond and an aromatic ring in the chemical structure; or A is an aliphatic tetravalent group and B is a divalent group having at least one chemical structure represented by the following chemical formula (2) in the chemical structure:

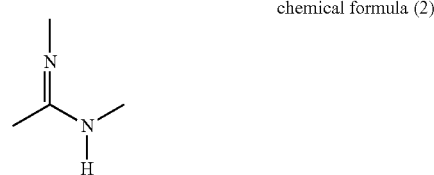

chemical formula (2)

and $X_1$ and $X_2$ are each independently hydrogen, a $C_{1-6}$ alkyl group or a $C_{3-9}$ alkylsilyl group.

34 Claims, No Drawings

(51) Int. Cl.
*B05D 3/02* (2006.01)
*B05D 3/04* (2006.01)
*B29C 39/02* (2006.01)
*B29C 39/22* (2006.01)
*C08J 5/18* (2006.01)
*B29K 79/00* (2006.01)
*B29L 31/34* (2006.01)

(56) References Cited

U.S. PATENT DOCUMENTS

| | | |
|---|---|---|
| 2003/0104232 A1 | 6/2003 | Kihara et al. |
| 2010/0187719 A1 | 7/2010 | Oishi et al. |
| 2011/0059305 A1 | 3/2011 | Kaneya et al. |
| 2012/0088040 A1 | 4/2012 | Matsumori et al. |

FOREIGN PATENT DOCUMENTS

| | | |
|---|---|---|
| JP | A-H01-223127 | 9/1989 |
| JP | A-05-203952 | 8/1993 |
| JP | A-H05-313169 | 11/1993 |
| JP | A-H06-051316 | 2/1994 |
| JP | A-H06-282071 | 10/1994 |
| JP | A-H07-304868 | 11/1995 |
| JP | A-2001-023778 | 1/2001 |
| JP | A-2002-003454 | 1/2002 |
| JP | A-2002-069179 | 3/2002 |
| JP | A-2002-114907 | 4/2002 |
| JP | A-2002-146021 | 5/2002 |
| JP | A-2003-168800 | 6/2003 |
| JP | A-2007-2023 | 1/2007 |
| JP | A-2009-163217 | 7/2009 |
| JP | A-2009-263570 | 11/2009 |
| JP | A-2009-263654 | 11/2009 |
| JP | A-2009-286706 | 12/2009 |
| JP | A-2010-031102 | 2/2010 |
| JP | A-2010-085615 | 4/2010 |
| JP | A-2010-150379 | 7/2010 |
| JP | A-2011-037818 | 2/2011 |
| JP | A-2011-257731 | 12/2011 |
| WO | WO 01/02466 A1 | 1/2001 |
| WO | WO 2008/146637 A1 | 12/2008 |
| WO | WO 2009/107429 A1 | 9/2009 |

OTHER PUBLICATIONS

Matsumoto, Toshihiko, "Nonaromatic Polymides Derived from Cycloaliphatic Monomers," Macromolecules, vol. 32, No. 15, 1999, pp. 4933-4939.
Office Action (Notice of Reason(s) for Rejection) in correspnoding Japanese Application No. 2013-504724 dated Sep. 1, 2015.
International Preliminary Report on Patentability mailed on Sep. 26, 2013 in International Application No. PCT/JP2012/056310.
Office Action in Chinese Application No. 201280022772.4, mailed Oct. 8, 2014.

POLYIMIDE PRECURSOR AND POLYIMIDE

TECHNICAL FIELD

The present invention relates to a polyimide having excellent properties such as transparency, bending resistance and high heat resistance in combination with an extremely low coefficient of linear thermal expansion and excellent solvent resistance, and a precursor thereof. The present invention also relates to a polyimide having excellent properties such as transparency, bending resistance and high heat resistance in combination with an extremely low coefficient of linear thermal expansion, excellent solvent resistance and flame resistance, and a precursor thereof.

BACKGROUND ART

Recently, with the coming of an advanced information society, development of optical materials such as an optical fiber and an optical waveguide in the field of optical communications and optical materials such as a liquid crystal orientation film and a color-filter protective film in the field of display devices has been advanced. Particularly in the field of display devices, a light and excellently flexible plastic substrate has been studied as an alternative for a glass substrate, and development of a display which can be bent and rolled has been aggressively made. In the circumstances, a higher performance optical material that can be used for such purposes has been demanded.

Polyimides are essentially colored in yellowish brown by intramolecular conjugation and charge-transfer complex formation. As a means to reduce the coloration, for example, a method of expressing transparency by inhibiting formation of intramolecular conjugation and charge-transfer complex by introducing fluorine, providing flexibility to the main chain, or introducing a bulky side chain is proposed. In addition, methods of expressing transparency by using semi-alicyclic or wholly alicyclic polyimide resins that do not, in principle, form charge-transfer complexes are proposed.

Patent Document 1 discloses that a thin-film transistor substrate is obtained by forming a thin-film transistor on a transparent-film substrate of a polyimide having an aliphatic group as a tetracarboxylic acid component residue by use of a conventional film-forming process in order to obtain a thin, light and rarely broken active matrix display device. The polyimide specifically used herein is prepared from 1,2,4,5-cyclohexanetetracarboxylic dianhydride as a tetracarboxylic acid component and 4,4'-diaminodiphenyl ether as a diamine component.

Patent Document 2 discloses a method for manufacturing a colorless transparent resin film formed of a polyimide excellent in colorless, transparency, heat resistance and planarity and used as a transparent substrate, a thin-film transistor substrate and a flexible wire substrate for liquid crystal display devices and organic EL display devices, by a solvent casting method using a particular drying step. The polyimide used herein is prepared from 1,2,4,5-cyclohexanetetracarboxylic dianhydride as a tetracarboxylic acid component and α,α-bis(4-aminophenyl)-1,4-diisopropylbenzene and 4,4'-bis(4-aminophenoxy)biphenyl as diamine components.

Patent Documents 3 and 4 disclose a polyimide soluble in an organic solvent, in which dicyclohexyltetracarboxylic acid is used as a tetracarboxylic acid component and diaminodiphenyl ether, diaminodiphenyl methane, 1,4-bis(4-aminophenoxy)benzene, 1,3-bis(4-aminophenoxy)benzene, 2,2-bis[4-(4-aminophenoxy)phenyl]propane, bis[4-(4-aminophenoxy)phenyl]sulfone, bis[4-(4-aminophenoxy)phenyl]ether or metaphenylenediamine is used as a diamine component.

Such a semi-alicyclic polyimide, in which an alicyclic tetracarboxylic dianhydride is used as a tetracarboxylic acid component and an aromatic diamine is used as a diamine component, has transparency, bending resistance and high heat resistance in combination. However, such a semi-alicyclic polyimide generally has a coefficient of linear thermal expansion as high as 50 ppm/K or more, which greatly differs from a coefficient of linear thermal expansion of a conductive material such as a metal, with the result that a failure such as large warpage may probably occur in a process of forming a circuitboard. In particular, there has been a problem that a process for forming a fine circuit for use in displays is not easily made.

In addition, such a semi-alicyclic polyimide tends to have insufficient solvent resistance and a failure might occur in a circuit forming process. Furthermore, this polyimide was sometimes inferior in flame resistance, decreasing the safety of electronic machines.

PRIOR ART REFERENCES

Patent Documents

Patent Document 1: Japanese Patent Laid-Open No. 2003-168800
Patent Document 2: International Publication No. WO 2008/146637
Patent Document 3: Japanese Patent Laid-Open No. 2002-69179
Patent Document 4: Japanese Patent Laid-Open No. 2002-146021

SUMMARY OF THE INVENTION

Problem to be Solved by the Invention

The present invention was made in the aforementioned circumstances, and an object thereof is to improve the coefficient of linear thermal expansion and solvent resistance of a semi-alicyclic polyimide in which an alicyclic tetracarboxylic dianhydride is used as a tetracarboxylic acid component and an aromatic diamine is used as a diamine component. Furthermore, an object of the present invention is to improve the coefficient of linear thermal expansion, solvent resistance and flame resistance of a polyimide in which an aliphatic tetracarboxylic dianhydride is used as a tetracarboxylic acid component.

More specifically, an object of the present invention is to provide a polyimide having excellent properties such as transparency, bending resistance and high heat resistance in combination with an extremely low coefficient of linear thermal expansion and excellent solvent resistance and a precursor thereof. Another object of the present invention is to provide a polyimide having excellent properties such as transparency, bending resistance and high heat resistance in combination with an extremely low coefficient of linear thermal expansion, excellent solvent resistance and flame resistance, and a precursor thereof.

Means for Solving the Problem

The present invention relates to the following items.
1. A polyimide precursor comprising a repeating unit represented by the following chemical formula (1):

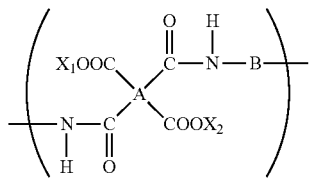

chemical formula (1)

wherein A is a tetravalent group having at least one aliphatic six-membered ring and no aromatic ring in the chemical structure, and B is a divalent group having at least one amide bond and an aromatic ring in the chemical structure; or A is an aliphatic tetravalent group and B is a divalent group having at least one chemical structure represented by the following chemical formula (2) in the chemical structure:

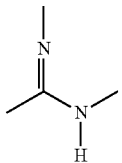

chemical formula (2)

and $X_1$ and $X_2$ are each independently hydrogen, a $C_{1-6}$ alkyl group or a $C_{3-9}$ alkylsilyl group.

2. The polyimide precursor according to the above item 1, wherein A is at least one selected from the group consisting of the following chemical formulae (3-1) to (3-4):

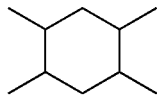

chemical formula (3-1)

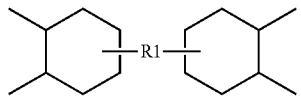

chemical formula (3-2)

wherein R1 is a direct bond, a $CH_2$ group, a $C(CH_3)_2$ group, an $SO_2$ group, an $Si(CH_3)_2$ group, a $C(CF_3)_2$ group, an oxygen atom or an sulfur atom;

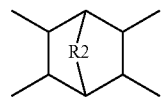

chemical formula (3-3)

wherein R2 is a $CH_2$ group, a $CH_2CH_2$ group, an oxygen atom or a sulfur atom;

chemical formula (3-4)

wherein R3 and R4 are each independently a $CH_2$ group, a $CH_2CH_2$ group, an oxygen atom or a sulfur atom.

3. The polyimide precursor according to the above item 1 or 2, wherein B is at least one selected from the group consisting of the following chemical formulae (4-1) to (4-4):

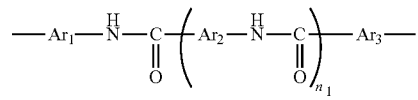

chemical formula (4-1)

wherein $Ar_1$, $Ar_2$ and $Ar_3$ are each independently a divalent group having an aromatic ring having 6 to 18 carbon atoms; and n1 is an integer of 0 to 5;

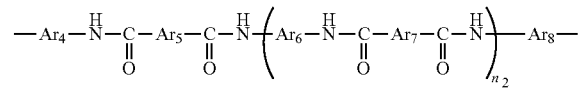

chemical formula (4-2)

wherein $Ar_4$, $Ar_5$, $Ar_6$, $Ar_7$ and $Ar_8$ are each independently a divalent group having an aromatic ring having 6 to 18 carbon atoms; and n2 is an integer of 0 to 5;

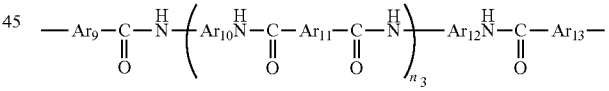

chemical formula (4-3)

wherein $Ar_9$, $Ar_{10}$, $Ar_{11}$, $Ar_{12}$ and $Ar_{13}$ are each independently a divalent group having an aromatic ring having 6 to 18 carbon atoms; and n3 is an integer of 0 to 5;

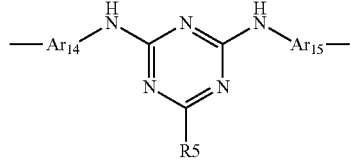

chemical formula (4-4)

wherein $Ar_{14}$ and $Ar_{15}$ are each independently a divalent aromatic group having 6 to 18 carbon atoms; and R5 is a hydrogen atom or a monovalent organic group.

4. The polyimide precursor according to any one of the above items 1 to 3, obtained from a tetracarboxylic acid component providing the repeating unit represented by chemical formula (1) in an amount of 70 mole % or more and other tetracarboxylic acid components in an amount of 30 mole % or less based on 100 mole % of the total tetracarboxylic acid components, and a diamine component providing the repeating unit represented by chemical formula (1) in an amount of 70 mole % or more and other diamine components in an amount of 30 mole % or less based on 100 mole % of the total diamine components.

5. The polyimide precursor according to the above item 4, wherein the diamine component comprises at least one of p-phenylenediamine, benzidine, 2,2'-bis(trifluoromethyl) benzidine, 3,3'-dimethylbenzidine, 2,2'-dimethylbenzidine or trans-cyclohexanediamine in an amount of 30 mole % or less, in addition to the diamine component providing the repeating unit represented by chemical formula (1).

6. The polyimide precursor according to any one of the above items 1 to 5, wherein the polyimide precursor has a logarithmic viscosity of 0.2 dL/g or more (temperature: 30° C., concentration: 0.5 g/dL, solvent: N,N-dimethylacetamide).

7. The polyimide precursor according to any one of the above items 1 to 6, obtained from a tetracarboxylic acid component having a purity of 99% or more and a diamine component having a purity of 99% or more, wherein in the case that plural stereoisomers are contained, the purity is determined by regarding the stereoisomers as a single component without distinguishing them.

8 The polyimide precursor according to any one of the above items 1 to 7, obtained from a tetracarboxylic acid component having a light transmittance of 70% or more and a diamine component having a light transmittance of 30% or more, wherein the light transmittance of the tetracarboxylic acid component is a transmittance at a wavelength of 400 nm and an optical path length of 1 cm as a 10% by mass solution in a 2 N sodium hydroxide solution, and the light transmittance of the diamine component is a transmittance at a wavelength of 400 nm and an optical path length of 1 cm as a 8% by mass solution in methanol, water, N,N-dimethylacetamide or acetic acid or hydrochloric acid solutions thereof.

9. The polyimide precursor according to any one of the above items 1 to 8 having a light transmittance of 40% or more at a wavelength of 400 nm and an optical path length of 1 cm as a 10% by mass solution in a solvent selected from N, N-dimethylformamide, N, N-dimethylacetamide, N-methyl-2-pyrrolidone, N-ethyl-2-pyrrolidone, 1,3-dimethyl-2-imidazolidinone, dimethylsulfoxide and water.

10. A polyimide precursor solution composition comprising the polyimide precursor according to any one of the above items 1 to 9 dissolved in a solvent, wherein the solvent has a light transmittance of 89% or more at a wavelength of 400 nm and an optical path length of 1 cm.

11. A polyimide containing a repeating unit represented by the following chemical formula (5):

chemical formula (5)

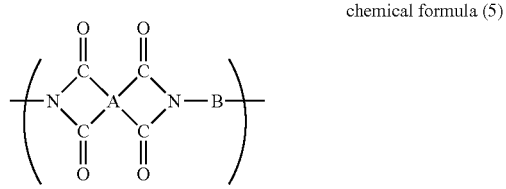

wherein A is a tetravalent group having at least one aliphatic six-membered ring and no aromatic ring in the chemical structure and B is a divalent group having at least one amide bond and an aromatic ring in the chemical structure; or A is an aliphatic tetravalent group and B is a divalent group having at least one chemical structure represented by the aforementioned chemical formula (2) in the chemical structure.

12. The polyimide according to the above item 11, having an total light transmittance (average light transmittance from 380 nm to 780 nm) of 70% or more, preferably 80% or more, more preferably 85% or more, when formed into a film having a thickness of 10 μm.

13. The polyimide according to the above items 11 or 12, having a light transmittance at 400 nm of 50% or more, preferably 60% or more, more preferably 70% or more, particularly preferably 75% or more as a film having a thickness of 10 μm, when formed into a film having a thickness of 10 μm.

14. The polyimide according to any one of the above items 11 to 13, having an average coefficient of linear thermal expansion at 50 to 200° C. of 50 ppm/K or less, preferably 45 ppm/K or less, more preferably 40 ppm/K or less, particularly preferably 20 ppm/K or less when formed into a film having a thickness of 10 μm.

15. The polyimide according to any one of the above items 11 to 14, wherein A in the chemical formula (5) is an aliphatic tetravalent group; B is a divalent group having at least one chemical structure represented by the chemical formula (2) in the chemical structure; and the polyimide has an oxygen index of 22% (volume fraction) or more.

16. A polyimide obtained through a reaction between an aliphatic tetracarboxylic acid component and a diamine component and having an oxygen index of 22% (volume fraction) or more.

17. A substrate for a display, a touch panel or a solar battery formed of the polyimide obtained from the polyimide precursor solution composition according to the above item 10 or the polyimide according to any one of the above items 11 to 16.

Effect of the Invention

According to the present invention, there is provided a polyimide having excellent properties such as transparency, bending resistance and high heat resistance in combination with an extremely low coefficient of linear thermal expansion and excellent solvent resistance, and a precursor thereof. The polyimide obtained from the polyimide precursor of the present invention and the polyimide of the present invention have high transparency and a low coefficient of linear thermal expansion allowing a fine circuit to be easily formed, and solvent resistance in combination. Therefore, they are suitably used for forming substrates for use in displays. Furthermore, the polyimides of the present invention can be suitably used also for forming substrates for touch panels and solar batteries.

Furthermore, according to the present invention, there is provided a polyimide having excellent properties such as transparency, bending resistance and high heat resistance in combination with an extremely low coefficient of linear thermal expansion, excellent solvent resistance and flame resistance, and a precursor thereof. The polyimide obtained from the polyimide precursor of the present invention and the polyimide of the present invention have high transparency and a low coefficient of linear thermal expansion allowing a fine circuit to be easily formed, solvent resistance, and flame resistance in combination. Therefore, they are suitably used for forming substrates for displays and substrates for touch panels and solar batteries.

EMBODIMENT FOR CARRYING OUT THE INVENTION

The polyimide precursor of the present invention is a polyimide precursor containing a repeating unit represented by the above chemical formula (1) in a structure. In other words, the polyimide precursor of the present invention is a semi-alicyclic polyimide precursor (A), which is obtained from an alicyclic tetracarboxylic acid component having at least one aliphatic six-membered ring and no aromatic ring in the chemical structure, and an aromatic diamine component having at least one amide bond and an aromatic ring in the chemical structure; or a polyimide precursor (B), which is obtained from an aliphatic tetracarboxylic acid component and a diamine component having at least one chemical structure represented by the above chemical formula (2) in the chemical structure.

The polyimide precursor of the present invention may be a polyimide precursor obtained by using other tetracarboxylic acid component(s) and/or diamine component(s). For example, a polyimide precursor may be obtained from a tetracarboxylic acid component providing a repeating unit represented by chemical formula (1) (more specifically, in the case of a polyimide precursor (A), an alicyclic tetracarboxylic acid component having at least one aliphatic six-membered ring and no aromatic ring in the chemical structure, and in the case of a polyimide precursor (B), an aliphatic tetracarboxylic acid component) in an amount of 70 mole % or more and the other tetracarboxylic acid component(s) in an amount of 30 mole % or less based on 100 mole % of the total tetracarboxylic acid components, and a diamine component providing a repeating unit represented by chemical formula (1) (more specifically, in the case of a polyimide precursor (A), an aromatic diamine component having at least one amide bond and an aromatic ring in the chemical structure, in the case of a polyimide precursor (B), a diamine component having at least one chemical structure represented by the following chemical formula (2) in the chemical structure) in an amount of 70 mole % or more and the other diamine component(s) in an amount of 30 mole % or less based on 100 mole % of the total diamine components.

A tetracarboxylic acid component and a diamine component of the polyimide precursor (A) of the present invention will be described.

The tetracarboxylic acid component to be used in the polyimide precursor (A) of the present invention is an alicyclic tetracarboxylic acid component having at least one aliphatic six-membered ring and no aromatic ring in the chemical structure. The six-membered ring contained in the tetracarboxylic acid component may also be plural and a plurality of six-membered rings may have two or more common carbon atoms as constituents. Furthermore, carbon atoms (within the six-membered ring) constituting a six-membered ring may chemically bind to each other to form another ring. In other words, the six-membered ring may have a crosslinked cyclic form.

It is preferable that the tetracarboxylic acid component have a highly symmetric six-membered ring structure, because a polymer chain can be densely packed and the resultant polyimide has excellent solvent resistance, heat resistance and mechanical strength. Furthermore, it is more preferable that the tetracarboxylic acid component is a polyalicyclic type having a plurality of six-membered rings having two or more common carbon atoms as constituents, or the tetracarboxylic acid component is a crosslinked cyclic type having a six-membered ring, in which carbon atoms constituting the ring chemically bind to each other to form another ring, because satisfactory heat resistance, solvent resistance and a low coefficient of linear thermal expansion of the resultant polyimide can be easily attained.

As the tetravalent group derived from the tetracarboxylic acid component represented by A in the above chemical formula (1), for example, groups represented by the above chemical formulae (3-1) to (3-4) are preferable; a group represented by the above chemical formula (3-3) or (3.4) is more preferable; and a group represented by the above chemical formula (3-4) is particularly preferable. Compared to the groups represented by the above chemical formulae (3-1) and (3-2), the groups represented by the above chemical formulae (3-3) and (3-4) are more preferable because they are a crosslinked cyclic type and thus the heat resistance of the polyimide is excellent and the coefficient of linear thermal expansion thereof is low. Furthermore, the group represented by the above chemical formula (3-4) is particularly preferable because it is a polyalicyclic/crosslinked cyclic type and thus the heat resistance of the polyimide is more excellent.

The examples of tetracarboxylic acid components to introduce the chemical structure of the above chemical formulae (3-1) and (3-2) include cyclohexane-1,2,4,5-tetracarboxylic acid, [1,1'-bi(cyclohexane)]-3,3',4,4'-tetracarboxylic acid, [1,1'-bi(cyclohexane)]-2,3,3',4'-tetracarboxylic acid, [1,1'-bi(cyclohexane)]-2,2',3,3'-tetracarboxylic acid, 4,4'-methylenebis(cyclohexane-1,2-dicarboxylic acid), 4,4'-(propane-2,2-diyl)bis(cyclohexane-1,2-dicarboxylic acid), 4,4'-oxybis(cyclohexane-1,2-dicarboxylic acid), 4,4'-thiobis(cyclohexane-1,2-dicarboxylic acid), 4,4'-sulfonylbis(cyclohexane-1,2-dicarboxylic acid), 4,4'-(dimethylsilanediyl)bis(cyclohexane-1,2-dicarboxylic acid), 4,4'-(tetrafluoropropane-2,2-diyl)bis(cyclohexane-1,2-dicarboxylic acid), and dianhydrides of these. Among these, preference is given to cyclohexane-1,2,4,5-tetracarboxylic acid, [1,1'-bi(cyclohexane)]-3,3',4,4'-tetracarboxylic acid, [1,1'-bi(cyclohexane)]-2,3,3',4'-tetracarboxylic acid, [1,1'-bi(cyclohexane)]-2,2',3,3'-tetracarboxylic acid and dianhydrides of these because they provide polyimides excellent in solvent resistance and mechanical strength.

Although it is not particularly limited, these tetracarboxylic components may be subjected to separation and refinement and the like, so that the percentage of particular stereoisomer(s) may be 80% or more, more preferably 90% or more, particularly preferably 95% or more, which increase the heat resistance and the solvent resistance of the polyimide. As the examples of the particular stereoisomer(s), preference is given to:

1R,2S,4S,5R-cyclohexane tetracarboxylic acid (hereinafter, it may be abbreviated as PMTA-HS, and its dianhydride may be abbreviated as PMDA-HS), 1S,2S,4R,5R-cyclohexane tetracarboxylic acid (hereinafter, it may be abbreviated as PMTA-HH, and its dianhydride may be abbreviated as PMDA-HH), (1R,1'S,3R,3'S,4R,4'S) dicyclohexyl-3,3',4,4'-tetracarboxylic acid (hereinafter, it may be abbreviated as trans-DCTA, and its dianhydride may be abbreviated as trans-DCDA), and (1R,1'S,3R,3'S,4S,4'R) dicyclohexyl-3,3',4,4'-tetracarboxylic acid (hereinafter, it may be abbreviated as cis-DCTA, and its dianhydride may be abbreviated as cis-DCDA); and more preference is given to PMTA-HS, trans-DCTA, cis-DCTA because they have high reactivity when converted to acid dianhydrides.

The examples of tetracarboxylic acid components of crosslinked cyclic type or polyalicyclic/crosslinked cyclic type to introduce the chemical structure of the above chemical formulae (3-3) and (3-4) include derivatives of octahydropentalene-1,3,4,6-tetracarboxylic acid, bicyclo[2.2.1]heptane-2,3,5,6-tetracarboxylic acid, 6-(carboxymethyl)bicyclo[2.2.1]heptane-2,3,5-tricarboxylic acid, bicyclo[2.2.2]octane-2,3,5,6-tetracarboxylic acid, bicyclo[2.2.2]octa-5-ene-2,3,7,8-tetracarboxylic acid, tricyclo[4.2.2.02,5]decane-3,4,7,8-tetracarboxylic acid, tricyclo[4.2.2.02,5]deca-7-ene-3,4,9,10-tetracarboxylic acid, 9-oxatricyclo[4.2.1.02,5]nonane-3,4,7,8-tetracarboxylic acid, decahydro-1,4:5,8-dimethanonaphthalene-2,3,6,7-tetracarboxylic acid and dianhydrides of these. Among them, preference is given to derivatives of bicyclo[2.2.1]heptane-2,3,5,6-tetracarboxylic acid, bicyclo[2.2.2]octane-2,3,5,6-tetracarboxylic acid, decahydro-1,4:5,8-dimethanonaphthalene-2,3,6,7-tetracarboxylic acid and dianhydrides of these because they allows easy production of polyimide and they provide polyimides having excellent heat resistance.

Although it is not particularly limited, these tetracarboxylic components may be subjected to separation and refinement and the like, so that the percentage of particular stereoisomer(s) may be 70% or more, more preferably 90% or more, particularly preferably 95% or more, which allows the production of a polyimide having low coefficient of linear thermal expansion. As the examples of the particular stereoisomer(s), preference is given to:

1rC7-bicyclo[2.2.2]octane2t,3t,5c,6c-tetracarboxylic acid (hereinafter, it may be abbreviated as cis/trans-BTTA-H, and its anhydride may be abbreviated as cis/trans-BTA-H), 1rC7-bicyclo[2.2.2]octane 2c, 3c, 5c, 6c-tetracarboxylic acid (hereinafter, it may be abbreviated as cis/cis-BTTA-H, and its dianhydride may be abbreviated as cis/cis-BTA-H), (4arH,8acH)-decahydro-1t,4t:5c,8c-dimethano naphthalene-2t,3t,6c,7c-tetracarboxylic acid (hereinafter, it may be abbreviated as DNTAxx, and its dianhydride may be abbreviated as DNDAxx), and (4arH,8acH)-decahydro-1t,4t:5c,8c-dimethano naphthalene-2c,3c,6c,7c-tetracarboxylic acid (hereinafter, it may be abbreviated as DNTAdx, and its dianhydride may be abbreviated as DNDAdx).

The structures of the above tetracarboxylic acid components are indicated below.

TABLE 1

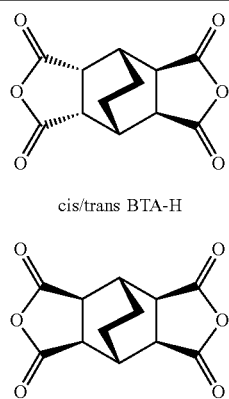

cis/trans BTA-H

TABLE 1-continued

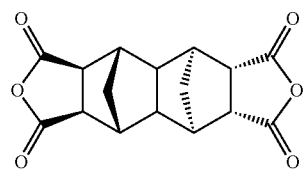 [SMILES: O=C1OC(=O)[C@H]2[C@@H]1[C@H]1C[C@@H]2C2C1[C@@H]1C[C@H]2[C@H]2C(=O)OC(=O)[C@H]21]

cis/cis BTA-H

DNDAxx

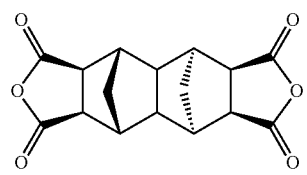 [SMILES: O=C1OC(=O)[C@H]2[C@@H]1[C@@H]1C[C@H]2C2C1[C@H]1C[C@@H]2[C@@H]2C(=O)OC(=O)[C@@H]21]

DNDAdx

As the tetracarboxylic acid component, the abovementioned tetracarboxylic acid components may be used alone or in combination of two or more.

In addition, other aromatic or aliphatic tetracarboxylic acid components generally employed for polyimides may be used together in a small amount within the range that the properties of the polyimide of the present invention can be achieved (preferably 30% by mole or less, more preferably 10% by mole or less, further preferably less than 10% by mole).

The examples of other aromatic or aliphatic tetracarboxylic acid components include derivatives of 2,2-bis(3,4-dicarboxyphenyl) hexafluoropropane, 4-(2,5-dioxotetrahydrofuran-3-yl)-1,2,3,4-tetrahydronaphthalene-1,2-dicarboxylic acid, pyromellitic acid, benzophenonetetracarboxylic acid, biphenyltetracarboxylic acid, oxydiphthalic acid, biscarboxyphenyldimethyl silane, bisdicarboxyphenoxy diphenyl sulfide, sulfonyldiphthalic acid, cyclobutanetetracarboxylic acid, isopropylidene phenoxybisphthalic acid and the like, and dianhydrides of these.

The tetracarboxylic acid component to be used in the present invention is not particularly limited; however, it preferably has a purity of 99% or more, and preferably 99.5% or more (in the case that plural stereoisomers are contained, the purity is determined by regarding the stereoisomers as a single component without distinguishing them; in the case of using a plurality of types of tetracarboxylic acid components, it is the value of a tetracarboxylic acid component having the highest purity, or it is an average purity value obtained by individually obtaining the purities of all tetracarboxylic acid components to be used and weighing them each by the mass ratio of the use amount thereof is regarded as the purity, namely, for example, when a tetracarboxylic acid component having a purity of 100% is used in an amount of 70 parts by mass and a tetracarboxylic acid component having a purity of 90% is used in an amount of 30 parts by mass, the purity of the tetracarboxylic acid component to be used is calculated as 97%). If the purity is less than 98%, the molecular weight of the resultant polyimide precursor is not sufficiently increased and the heat resistance of the resultant polyimide is sometimes inferior. The purity is a value obtained by gas chromatographic analysis or $^1$H-NMR analysis. In the case of a tetracarboxylic dianhydride, the purity thereof can be obtained in terms of tetracarboxylic acid obtained by hydrolyzing the tetracarboxylic dianhydride.

Furthermore, the tetracarboxylic acid component to be used in the present invention is not particularly limited; however, it preferably has a light transmittance of 70% or more, preferably 80% or more and more preferably 90% or more (in the case of using a plurality of types of tetracarboxylic acid components, it is the value of a tetracarboxylic acid component having the most excellent light transmittance, or it is an average light transmittance value obtained by individually obtaining the purities of all tetracarboxylic acid components to be used and weighing them each by the mass ratio of the use amount thereof is regarded as the light transmittance, namely, for example, when a tetracarboxylic acid component having a light transmittance of 100% is used in an amount of 70 parts by mass and a tetracarboxylic acid component having a light transmittance of 90% is used in an amount of 30 parts by mass, the light transmittance of the tetracarboxylic acid component to be used is calculated as 97%). Note that the light transmittance herein is a transmittance at a wavelength of 400 nm and an optical path length of 1 cm as a 10% by mass solution obtained by dissolving a tetracarboxylic acid component in a 2N sodium hydroxide solution. The light transmittance of a tetracarboxylic acid component is preferably 70% or more, because degree of coloration of the resultant polyimide is reduced.

The diamine component to be used in the polyimide precursor (A) of the present invention is a diamine component having at least one amide bond and an aromatic ring in the chemical structure.

An amide bond is introduced by a diamine component into the chemical structure of the polyimide precursor (A) of the present invention. In the polyimide obtained from the polyimide precursor to which an amide bond is introduced, since intermolecular interaction is increased by the amide bond, the coefficient of linear thermal expansion, solvent resistance or the like are improved. Therefore, the diamine component preferably has one or more amide bonds, preferably a plurality of amide bonds, in the chemical structure. Note that, if the number of amide bonds in a diamine component is excessively large, the solubility of the resultant polyimide precursor may sometimes decrease.

As the divalent group derived from the diamine component represented by B in the above chemical formula (1), for example, groups represented by the above chemical formulae (4-1) to (4-3) are preferable.

$Ar_1$ to $Ar_{13}$ in the above chemical formula (4-1) to (4.3) are each independently a divalent group having an aromatic ring having 6 to 18 carbon atoms. The aromatic ring herein refers to a divalent aromatic compound such as benzene, biphenyl, terphenyl, naphthalene and anthracene. A part of hydrogen atoms of the aromatic ring may be substituted with $C_{1-3}$ alkyl group, halogen group, nitro group, hydroxyl group, carboxylic group and the like. As the divalent aromatic compound, benzene and biphenyl are preferable since the light transmittance of the resultant polyimide is excellent. Furthermore, although it is not particularly limited, the bonding position of a divalent aromatic compound (bonding position for forming a polyimide main chain) is preferably the para position in the case of benzene, biphenylene and terphenyl, and the 2- or 6-position in the case of naphthalene and anthracene, because the coefficient of linear thermal expansion of the resultant polyimide can be reduced.

The examples of the diamine components to introduce the chemical structure of the above chemical formulae (4.1) to (4-3) include 4,4'-diaminobenzanilide, 3'-chloro-4,4'-diaminobenzanilide, 2'-chloro-4,4-diaminobenzanilide, 2',6'-dichloro-4,4'-diaminobenzanilide, 3'-methyl-4,4'-diaminobenzanilide, 2'-methyl-4,4'-diaminobenzanilide, 2',6'-dimethyl-4,4'-diaminobenzanilide, 3'-trifluoromethyl-4,4'-diaminobenzanilide, 2'-trifluoromethyl-4,4'-diaminobenzanilide, 3-chloro-4,4'-diaminobenzanilide, 3-bromo-4,4'-diaminobenzanilide, 3-methyl-4,4'-diaminobenzanilide, 2-chloro-4,4'-diaminobenzanilide, 2-bromo-4,4'-diaminobenzanilide, 2-methyl-4,4'-diaminobenzanilide, 4,3'-diaminobenzanilide, 4'-fluoro-4,3'-diaminobenzanilide, 4'-chloro-4,3'-diaminobenzanilide, 4'-bromo-4,3'-diaminobenzanilide, 3,4'-diaminobenzanilide, 4-chloro-3,4'-diaminobenzanilide, 4-methyl-3,4'-diaminobenzanilide, N,N'-bis(4-aminophenyl)terephthalamide (4-APTP), N,N'-bis(4-aminophenyl)-2,5-dichloroterephthalamide, N,N'-bis(4-aminophenyl)-2,5-dimethylterephthalamide, N,N'-bis(4-aminophenyl)-2,3,5,6-tetrafluoroterephthalamide, N,N'-bis(4-aminophenyl)-2,3,5,6-tetrafluoroterephthalamide, N,N'-bis(4-aminophenyl)-2,3,5,6-tetrachloroterephthalamide, N,N'-bis(4-aminophenyl)-2,3,5,6-tetrabromoterephthalamide, N,N'-bis(4-aminophenyl)-4-bromoisophthalamide, N,N'-bis(4-aminophenyl)-5-tert-butylisophthalamide, N,N'-p-phenylenebis (p-aminobenzamide), N,N'-m-phenylenebis (p-aminobenzamide) and derivative of these. Among these, 4,4'-diaminobenzanilide, N,N'-bis(4-aminophenyl)terephthalamid and N,N'-p-phenylenebis (p-aminobenzamide) are preferred, and N,N'-bis(4-aminophenyl)terephthalamid and N,N'-p-phenylenebis (p-aminobenzamide) are more preferred because they provides polyimide having low coefficient of thermal expansion.

As the diamine component, the abovementioned diamine components may be used alone or in combination of two or more.

In addition, other diamine components generally employed for polyimides may be used together in a small amount within the range that the properties of the polyimide of the present invention can be achieved (preferably 30% by mole or less, more preferably 10% by mole or less, further preferably less than 10% by mole).

The examples of other diamine components used in the present invention include oxydianiline, p-phenylenediamine, m-phenylenediamine, benzidine, 3,3'-dimethylbenzidine, 2,2'-dimethylbenzidine, p-methylene bis(phenylenediamine), bis(aminophenoxy)benzene, bis[(aminophenoxy)phenyl]hexafluoropropane, bis(aminophenyl)hexafluoropropane, bis(aminophenyl)sulfone, bis(trifluoromethyl)benzidine, cyclohexane diamine, bis[(aminophenoxy)phenyl]propane, bis(aminohydroxyphenyl)hexafluoropropane, bis[(aminophenoxy)diphenyl]sulfone and the like. As the other diamine components used together, preference is given to p-phenylenediamine, benzidine, 3,3'-dimethylbenzidine, 2,2'-dimethylbenzidine, 2,2'-bis(trifluoromethyl)benzidine, bis(aminophenoxy)benzene, or trans-cyclohexanediamine because they can provide polyimides having low coefficient of linear thermal expansion.

The diamine component to be used in the present invention is not particularly limited; however, it preferably has a purity of 99% or more, and more preferably 99.5% or more (in the case of using a plurality of types of diamine components, it is the value of a diamine component having the highest purity, or it is an average purity value obtained by individually obtaining the purities of all diamine components to be used and weighing them each by the mass ratio of the use amount thereof is regarded as the purity, namely, for example, when a diamine component having a purity of 100% is used in an amount of 70 parts by mass and a diamine component having a purity of 90% is used in an amount of 30 parts by mass, the purity of the diamine component to be used is calculated as 97%). If the purity is less than 98%, the molecular weight of the resultant polyimide precursor is not sufficiently increased and the heat resistance of the resultant polyimide is sometimes inferior. The purity is a value obtained by gas chromatographic analysis or liquid chromatographic analysis.

Furthermore, the diamine component to be used in the present invention is not particularly limited; however, it preferably has a light transmittance of 30% or more (in the case of using a plurality of types of diamine components, it is the value of a diamine component having the most excellent light transmittance, or it is an average light transmittance value obtained by individually obtaining the purities of all diamine components to be used and weighing them each by the mass ratio of the use amount thereof is regarded as the light transmittance, namely for example, when a diamine component having a light transmittance of 100% is used in an amount of 70 parts by mass and a diamine component having a light transmittance of 90% is used in an amount of 30 parts by mass, the light transmittance of the diamine component to be used is calculated as 97%). Note that the light transmittance herein is a transmittance at a wavelength of 400 nm and an optical path length of 1 cm as an 8% by mass solution obtained by dissolving a diamine component in methanol, water, N,N-dimethylacetamide or acetic acid or hydrochloric acid solutions thereof. The light transmittance of a diamine component is preferably 30% or more, because degree of coloration of the resultant polyimide is reduced.

Next, a tetracarboxylic acid component and a diamine component of the polyimide precursor (B) of the present invention will be described.

The tetracarboxylic acid component to be used in the polyimide precursor (B) of the present invention is not particularly limited as long as it is an aliphatic tetracarboxylic acid component; however, it is preferably an alicyclic tetracarboxylic acid component having at least one aliphatic six-membered ring and no aromatic ring in the chemical structure. The six-membered ring contained in the tetracarboxylic acid component may also be plural and a plurality of six-membered rings may have two or more common carbon atoms as constituents. Furthermore, carbon atoms (within the six-membered ring) constituting a six-membered ring may chemically bind to each other to form another ring. In other words, the six-membered ring may have a crosslinked cyclic form.

It is preferable that the tetracarboxylic acid component not have an asymmetric but a highly symmetric six-membered ring structure, because a polymer chain can be densely packed and the resultant polyimide has excellent solvent resistance, heat resistance and mechanical strength. Furthermore, it is more preferable that tetracarboxylic acid component have polyalicyclic type of six-membered rings having two or more common carbon atoms as constituents, or the tetracarboxylic acid component is a crosslinked cyclic type of six-membered ring, in which carbon atoms constituting the ring chemically bind to each other to form another ring, because satisfactory heat resistance, solvent resistance and a low coefficient of linear thermal expansion of the resultant polyimide can be easily attained.

As the tetravalent group derived from the tetracarboxylic acid component represented by A in the above chemical formula (1), for example, groups represented by the above chemical formulae (3-1) to (3-4) are preferable; a group represented by the above chemical formula (3-3) or (3-4) is more preferable; and a group represented by the above chemical formula (3-4) is particularly preferable. Compared to the groups represented by the above chemical formulae (3-1) and (3-2), the groups represented by the above chemical formulae (3-3) and (3-4) are more preferable because they are a crosslinked cyclic type and thus the heat resistance of the polyimide is excellent and the coefficient of linear thermal expansion thereof is low. Furthermore, the group represented by the above chemical formula (3-4) is particularly preferable because it is a polyalicyclic/crosslinked cyclic type and thus the heat resistance of the polyimide is more excellent.

The examples of tetracarboxylic acid components to introduce the chemical structure of the above chemical formulae (3-1) and (3-2) include the same examples as those listed for the polyimide precursor (A), and preferable examples are the same.

The examples of tetracarboxylic acid components to introduce the chemical structure of the above chemical formulae (3-3) or (3-4) include the same examples as those listed for the polyimide precursor (A), and preferable examples are the same.

As the tetracarboxylic acid component, the tetracarboxylic acid component as mentioned above can be used alone or in combination of a plurality of types.

Furthermore, other aromatic or aliphatic tetracarboxylic acid components generally employed for polyimides may be used together in a small amount within the range that the properties of the polyimide of the present invention can be achieved, (preferably 30 mole % or less, more preferably 10 mole % or less, further preferably less than 10 mole %).

The tetracarboxylic acid component to be used in the present invention is not particularly limited; however, it preferably has a purity of 99% or more, and preferably 99.5% or more (in the case that plural stereoisomers are contained, the purity is determined by regarding the stereoisomers as a single component without distinguishing them; in the case of using a plurality of types of tetracarboxylic acid components, it is the value of a tetracarboxylic acid component having the highest purity, or it is an average purity value obtained by individually obtaining the purities of all tetracarboxylic acid components to be used and weighing them each by the mass ratio of the use amount thereof is regarded as the purity, namely, for example, when a tetracarboxylic acid component having a purity of 100% is used in an amount of 70 parts by mass and a tetracarboxylic acid component having a purity of 90% is used in an amount of 30 parts by mass, the purity of the tetracarboxylic acid component to be used is calculated as 97%). If the purity is less than 98%, the molecular weight of the resultant polyimide precursor is not sufficiently increased and the heat resistance of the resultant polyimide is sometimes inferior. The purity is a value obtained by gas chromatographic analysis or $^1$H-NMR analysis. In the case of a tetracarboxylic dianhydride, the purity thereof can be obtained in terms of tetracarboxylic acid obtained by hydrolyzing the tetracarboxylic dianhydride.

Furthermore, the tetracarboxylic acid component to be used in the present invention is not particularly limited; however, it preferably has a light transmittance of 70% or more, preferably 80% or more and more preferably 90% or more (in the case of using a plurality of types of tetracarboxylic acid components, it is the value of a tetracarboxylic acid component having the most excellent light transmittance, or it is an average light transmittance value obtained by individually obtaining the purities of all tetracarboxylic acid components to be used and weighing them each by the mass ratio of the use amount thereof is regarded as the light transmittance, namely, for example, when a tetracarboxylic acid component having a light transmittance of 100% is used in an amount of 70 parts by mass and a tetracarboxylic acid component having a light transmittance of 90% is used in an amount of 30 parts by mass, the light transmittance of the tetracarboxylic acid component to be used is calculated as 97%). Note that the light transmittance herein is a transmittance at a wavelength of 400 nm and an optical path length of 1 cm as a 10% by mass solution obtained by dissolving a tetracarboxylic acid component in a 2N sodium hydroxide solution. The light transmittance of a tetracarboxylic acid component is preferably 70% or more, because degree of coloration of the resultant polyimide is reduced.

The diamine component to be used in the polyimide precursor (B) of the present invention is a diamine component having at least one chemical structure represented by the above chemical formula (2) in the chemical structure.

The chemical structure represented by the above chemical formula (2) is introduced into the chemical structure of the polyimide precursor (B) of the present invention by a diamine component. In the polyimide obtained from the polyimide precursor having the chemical structure represented by the above chemical formula, a coefficient of linear thermal expansion, solvent resistance or the like are improved presumably because intermolecular interaction is augmented by the introduced chemical structure represented by the above chemical formula (2). Furthermore, flame resistance (as an indicator thereof, the oxygen index is used) or adhesion are improved presumably because the chemical structure represented by the above chemical formula (2) has two nitrogen atoms, and thus, the nitrogen atoms can be efficiently introduced into the resultant polyimide. Therefore, the diamine component preferably contains one or more chemical structures represented by the above chemical formula (2), preferably a plurality of chemical structures represented by the above chemical formula (2) in the chemical structure.

As the divalent group derived from the diamine component represented by B in the above chemical formula (1), for example, groups represented by the above chemical formula (4-4) is preferable. That is, the diamine components preferably used are diamines represented by the following chemical formula (4-5):

chemical formula (4-5)

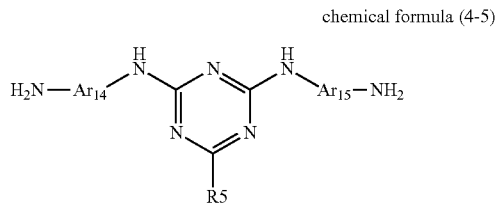

wherein $Ar_{14}$ and $Ar_{15}$ are each independently a divalent aromatic group having 6 to 18 carbon atoms; and R5 is a hydrogen atom or a monovalent organic group.

The examples of diamines represented by the aforementioned chemical formula (4-5) include 2,4-bis(4-aminoanilino)-1,3,5-triazine, 2,4-bis(4-aminoanilino)-6-methyl-1,3,5-triazine, 2,4-bis(4-aminoanilino)-6-ethyl-1,3,5-triazine, 2,4-bis(4-aminoanilino)-6-phenyl-1,3,5-triazine, 2,4-bis(4-aminoanilino)-6-amino-1,3,5-triazine, 2,4-bis(4-aminoanilino)-6-methylamino-1,3,5-triazine, 2,4-bis(4-aminoanilino)-6-dimethylamino-1,3,5-triazine, 2,4-bis(4-aminoanilino)-6-ethylamino-1,3,5-triazine, 2,4-bis(4-aminoanilino)-6-diethylamino-1,3,5-triazine, 2,4-bis(4-aminoanilino)-6-anilino-1,3,5-triazine, and 2,4-bis(4-aminoanilino)-6-diphenylamino-1,3,5-triazine. Among these, preferred are 2,4-bis(4-aminoanilino)-6-amino-1,3,5-triazine, 2,4-bis(4-aminoanilino)-6-methylamino-1,3,5-triazine, 2,4-bis(4-aminoanilino)-6-ethylamino-1,3,5-triazine, 2,4-bis(4-aminoanilino)-6-anilino-1,3,5-triazine and more preferred are 2,4-bis(4-aminoanilino)-6-anilino-1,3,5-triazine.

As the diamine component, the abovementioned diamine components may be used alone or in combination of two or more.

In addition, other diamine components generally employed for polyimides may be used together in a small amount within the range that the properties of the polyimide of the present invention can be achieved (preferably 30% by mole or less, more preferably 10% by mole or less, further preferably less than 10% by mole).

The diamine component to be used in the present invention is not particularly limited; however, it preferably has a purity of 99% or more, and more preferably 99.5% or more (in the case of using a plurality of types of diamine components, it is the value of a diamine component having the highest purity, or it is an average purity value obtained by individually obtaining the purities of all diamine components to be used and weighing them each by the mass ratio of the use amount thereof is regarded as the purity, namely, for example, when a diamine component having a purity of 100% is used in an amount of 70 parts by mass and a diamine component having a purity of 90% is used in an amount of 30 parts by mass, the purity of the diamine component to be used is calculated as 97%). If the purity is less than 98%, the molecular weight of the resultant polyimide precursor is not sufficiently increased and the heat resistance of the resultant polyimide is sometimes inferior. The purity is a value obtained by gas chromatographic analysis.

Furthermore, the diamine component to be used in the present invention is not particularly limited; however, it preferably has a light transmittance of 30% or more (in the case of using a plurality of types of diamine components, it is the value of a diamine component having the most excellent light transmittance, or it is an average light transmittance value obtained by individually obtaining the purities of all diamine components to be used and weighing them each by the mass ratio of the use amount thereof is regarded as the light transmittance, namely, for example, when a diamine component having a light transmittance of 100% is used in an amount of 70 parts by mass and a diamine component having a light transmittance of 90% is used in an amount of 30 parts by mass, the light transmittance of the diamine component to be used is calculated as 97%). Note that the light transmittance herein is a transmittance at a wavelength of 400 nm and an optical path length of 1 cm as an 8% by mass solution obtained by dissolving a diamine component in methanol, water, N,N-dimethylacetamide or acetic acid or hydrochloric acid solutions thereof. The light transmittance of a diamine component is preferably 30% or more, because degree of coloration of the resultant polyimide is reduced.

In the polyimide precursor of the present invention, $X_1$ and $X_2$ in the above chemical formula (1) are each independently hydrogen or a $C_{1-6}$ alkyl group, preferably a $C_{1-3}$ alkyl group, or a $C_{3-9}$ alkylsilyl group. The types and introduction ratio of functional groups represented by $X_1$ and $X_2$ can be changed by the production method described later.

If $X_1$ and $X_2$ are hydrogen, a polyimide tends to be easily produced.

Furthermore, if $X_1$ and $X_2$ are each a $C_{1-6}$ alkyl group, preferably a $C_{1-3}$ alkyl group, the storage stability of the polyimide precursor tends to be excellent. In this case, $X_1$ and $X_2$ are each more preferably a methyl group or an ethyl group.

Furthermore, if $X_1$ and $X_2$ are each a $C_{3-9}$ alkylsilyl group, the solubility of the polyimide precursor tends to be excellent. Furthermore, if $X_1$ and $X_2$ are each a $C_{3-9}$ alkylsilyl group (more specifically, the case of using a sililating agent), usually, a coefficient of linear thermal expansion tends to further decrease although situation varies depending upon the tetracarboxylic acid component and the diamine component (more specifically, depending upon components A and B in chemical formula (1)). In this case, it is preferable that $X_1$ and $X_2$ each be a trimethylsilyl group or a t-butyldimethylsilyl group.

The introduction ratio of a functional group is not particularly limited. In the case of introducing an alkyl group or an alkylsilyl group, an alkyl group or an alkylsilyl group can be introduced as $X_1$ and $X_2$, in a ratio of 25% or more, preferably 50% or more, and more preferably 75% or more.

The polyimide precursors of the present invention can be classified depending upon the chemical structure taken by $X_1$ and $X_2$ to 1) polyamic acids ($X_1$ and $X_2$ are hydrogen), 2) polyamic acid esters (at least part of $X_1$ and $X_2$ is an alkyl group) and 3) polyamic silyl esters (at least part of $X_1$ and $X_2$ is an alkylsilyl group). The polyimide precursors of the present invention can be easily produced by the following production methods, respectively according to these classes. However, the production method for the polyimide precursor of the present invention is not limited to the following production methods. Furthermore, a plurality of structures of the classes mentioned above can be introduced in a same molecule chain of a polyimide precursor and a plurality of types of polyimide precursors of the classes mentioned above can be used as a mixture.

1) Polyamic Acid

The polyimide precursor of the present invention can be suitably obtained as a polyimide precursor solution composition by reacting a tetracarboxylic acid component (preferably a tetracarboxylic dianhydride) and a diamine component in almost equal moles, preferably in a molar ratio of the diamine component to the tetracarboxylic acid component [diamine component mole number to tetracarboxylic acid component mole number] of preferably 0.90 to 1.10, and more preferably 0.95 to 1.05, in a solvent at a relatively low temperature such as 120° C. or less to suppress the imidization.

Although it is not particularly limited, more specifically, a polyimide precursor solution composition can be obtained by dissolving a diamine in a solvent, gradually adding a tetracarboxylic dianhydride to the solution while stirring, and stirring the solution at a temperature in the range of 0 to 120° C., preferably 5 to 80° C. for 1 to 72 hours. In the case where the reaction is performed at 80° C. or more, the molecular weight varies depending upon temperature history during polymerization. In addition, since imidization proceeds with heat, there is a possibility that a polyimide precursor is not stably produced. The addition order of a diamine and a tetracarboxylic dianhydride in the above production method is preferable since the molecular weight of the polyimide precursor is easily increased. Furthermore, it is also possible and preferable to invert the addition order of a diamine and a tetracarboxylic dianhydride in the above production method since the amount of precipitate is reduced.

Furthermore, with respect to molar ratios of the tetracarboxylic acid component and the diamine component, if the ratio of the diamine component is excessive, if necessary, a carboxylic acid derivative may be added in an amount substantially corresponding to the excessive mole number of the diamine component. In this manner, the molar ratio of the tetracarboxylic acid component and the diamine component can be brought closer to almost an equivalent. As the carboxylic acid derivative used herein, a tetracarboxylic acid which does not substantially increase the viscosity of a polyimide precursor solution, in other words, is not substantially involved in molecular chain extension, or a tricarboxylic acid serving as an end terminating agent and an anhydride thereof, and a dicarboxylic acid and an anhydride thereof are suitable.

2) Polyamic Acid Ester

A tetracarboxylic dianhydride is reacted with an arbitral alcohol to obtain a diester dicarboxylic acid, which is then reacted with a chlorinating reagent (e.g., thionyl chloride, oxalyl chloride) to obtain a diester dicarboxylic acid chloride. The diesterdicarboxylic acid chloride and a diamine are stirred in the range of −20 to 120° C., preferably −5 to 80° C., for 1 to 72 hours to obtain a polyimide precursor. In the case where the reaction is performed at 80° C. or more, the molecular weight varies depending upon temperature history during polymerization and, in addition, imidization proceeds with heat. As a result, there is a possibility that a polyimide precursor is not stably produced. Furthermore, a polyimide precursor can be easily obtained by dehydration condensation between a diester dicarboxylic acid and a diamine by use of a phosphorous-based condensing agent or a carbodiimide condensing agent.

Since the polyimide precursor obtained by this method is stable, the polyimide precursor can be purified through e.g., reprecipitation performed by adding a solvent such as water or alcohols.

3) Polyamic Silyl Ester

A diamine and a sililating agent are reacted to obtain a sililated diamine in advance. If necessary, the sililated diamine is purified by e.g., distillation. Then, the sililated diamine is dissolved in a dehydrated solvent. To the solution, a tetracarboxylic dianhydride is gradually added while stirring. The mixture is stirred in the range of 0 to 120° C., and preferably 5 to 80° C. for 1 to 72 hours to obtain a polyimide precursor. In the case where the reaction is performed at 80° C. or more, the molecular weight varies depending upon temperature history during polymerization and, in addition, imidization proceeds with heat. As a result, there is a possibility that a polyimide precursor is not stably produced.

Alternatively, to the polyamic acid obtained in 1) the production method of a polyamic acid above, a sililating agent is added and stirred in the range of 0 to 180° C., and preferably 5 to 150° C., for 1 to 72 hours to obtain a polyimide precursor. Particularly the case where the reaction is performed at 150° C. or less is preferable, because a polyimide precursor can be obtained stably while suppressing an imidization reaction.

The sililating agent used herein is not particularly limited as long as it is a $C_{3-9}$ alkylsilyl compound. For example, halogenated trialkylsilyl and a sililating agent containing no halogen can be used. As the halogenated trialkylsilyl, preference is given to trimethylsilyl chloride, triethylsilyl chloride, isopropyldimethylsilyl chloride, t-butyldimethylsilyl chloride, and triisopropylsilyl chloride, and particularly preferably to trimethylsilyl chloride and t-butyldimethylsilyl chloride because they have high reactivity and are inexpensive. As the sililating agent containing no halogen such as a chlorine atom, the examples thereof include N,O-bis(trimethylsilyl)trifluoroacetamide, N,O-bis(trimethylsilyl)acetamide, and hexamethyldisilazane. Using the sililating agent containing no halogen such as a chlorine atom is preferable since it is not necessary to purify the sililated diamine. Furthermore, N,O-bis(trimethylsilyl) acetamido and hexamethyldisilazane are particularly preferable since they contain no fluorine atoms and are inexpensive.

Furthermore, in the silylation reaction of a diamine, an amine catalyst such as pyridine, piperidine and triethylamine can be used to facilitate the reaction. The catalyst can be used as it is as a catalyst for polymerizing a polyimide precursor.

All of the methods of production described above can be suitably performed in organic solvents. As a result, the polyimide precursor solution composition of the present invention can be readily prepared.

As a solvent used in the production of the polyimide precursors, preference is given to aprotic solvents, such as N, N-dimethylformamide, N, N-dimethylacetamide, N-methyl-2-pyrrolidone, N-ethyl-2-pyrrolidone, 1,3-dimethyl-2-imidazolidinone and dimethyl sulfoxide, and water; and particularly N,N'-dimethylacetamide is preferable. However, the structure of the solvent is not particularly limited and any solvents may be used as long as the starting monomer components and the produced polyimide precursors are dissolved in the solvents. The examples of solvents preferably employed include amide solvents such as N, N-dimethylformamide, N,N-dimethylacetamide and N-methylpyrrolidone; cyclic ester solvents such as γ-butyrolactone, γ-valerolactone, δ-valerolactone, γ-caprolactone, ε-caprolactone, and α-methyl-γ-butyrolactone; carbonate solvents such as ethylene carbonate and propylene carbonate; glycol-based solvents such as triethylene glycol; phenol-based solvents such as m-cresol, p-cresol, 3-chlorophenol and 4-chlorophenol; acetophenone, 1,3-dimethyl-2-imidazolidinone, sulfolane, dimethylsulfoxide and water. In addition, other common organic solvents, for example, phenol, o-cresol, butyl acetate, ethyl acetate, isobutyl acetate, propyleneglycol methyl acetate, ethyl cellosolve, butyl cellosolve, 2-methylcellosolve acetate, ethylcellosolve acetate, butylcellosolve acetate, tetrahydrofuran, dimethoxyethane, diethoxyethane, dibutyl ether, diethylene glycol dimethyl ether, methyl isobutyl ketone, diisobutyl ketone, cyclopentanone, cyclohexanone, methyl ethyl ketone, acetone, butanol, ethanol, xylene, toluene, chlorobenzene, turpentine, mineral spirits, and petroleum naphtha-based solvents may be used.

The solvent for use in preparing a polyimide precursor and the solvent for use in a polyimide precursor solution composition as described later (hereinafter sometimes collectively referred to as the "solvent to be used") preferably satisfy at least one of the following conditions (specified below) of properties involved in purity: (a) light transmittance, (b) light transmittance after heating to reflux, (c) purity by gas chromatographic analysis, (d) ratio of peaks of impurities by gas chromatographic analysis, (e) amount of nonvolatile components, and (f) the content of metal components; and, in general, more preferably satisfy the conditions as many as possible.

(a) As the solvent to be used, a solvent has a light transmittance of 89% or more, more preferably 90% or more, and particularly preferably 91% or more at a wavelength of 400 nm and an optical path length of 1 cm.

(b) As the solvent to be used, a solvent has a light transmittance of 20% or more, more preferably 40% or more, and particularly preferably 80% or more at a wavelength of 400 nm and an optical path length of 1 cm after heating to reflux in nitrogen for 3 hours.

(c) As the solvent to be used, a solvent has a purity of 99.8% or more, more preferably 99.9% or more, and further preferably 99.99% or more, as measured by gas chromatographic analysis.

(d) As the solvent to be used, a solvent satisfies that amount of impurities of which peak appears on the longer time side with respect to the main component peak retention time in gas chromatography is less than 0.2%, more preferably 0.1% or less, particularly preferably 0.05% or less.

(e) The amount of components nonvolatile at 250° C. in the solvent to be used is 0.1% or less, more preferably 0.05% or less, and particularly preferably 0.01% or less.

(f) The content of metal components (for example, Li, Na, Mg, Ca, Al, K, Ca, Ti, Cr, Mn, Fe, Co, Ni, Cu, Zn, Mo, Cd) in the solvent to be used is 10 ppm or less, more preferably 1 ppm or less, particularly preferably 500 ppb or less, and further particularly preferably 300 ppb or less.

The requirements for these characteristics are based on the entire organic solvents to be used. That is, the organic solvents to be used may be one type or two or more types. The use of two or more types of organic solvents means a case of using a solvent mixture in a specific step and a case of using different solvents in different steps such that the polymerization solvent and the solvent for diluting an additive are different from each other. In the case of using two or more types of organic solvents (hereinafter, referred to as a solvent mixture), each requirement for characteristics relating to the purity is applied to the solvent mixture as a whole. In the case where different solvents are used in different steps, each requirement for characteristics relating to the purity is applied to the mixture of all organic solvents finally contained in a varnish. The characteristics may be each measured for a mixture prepared actually mixing organic solvents. Alternatively, the characteristics may be each measured for each organic solvent, and the characteristic of a mixture as a whole may be determined by calculation. For example, when 70 parts of solvent A having a purity of 100% and 30 parts of solvent B having a purity of 90% are used, the organic solvent used has a purity of 97%.

In the present invention, the logarithmic viscosity of a polyimide precursor is not particularly limited; however, it is preferable that the logarithmic viscosity of a polyimide precursor in N,N-dimethylacetamide solution of 0.5 g/dL in concentration at 30° C. is 0.2 dL/g or more, and preferably 0.5 dL/g or more. If the logarithmic viscosity is 0.2 dL/g or more, the molecular weight of a polyimide precursor is high and thus the mechanical strength and heat resistance of the resultant polyimide are excellent.

The polyimide precursor of the present invention is not particularly limited; however, when a polyimide precursor is dissolved in a solvent selected from N, N-dimethylformamide, N,N-dimethylacetamide, N-methyl-2-pyrrolidone, N-ethyl-2-pyrrolidone, 1,3-dimethyl-2-imidazolidinone, dimethylsulfoxide and water in a concentration of 10 mass % to obtain a solution, a light transmittance at a wavelength of 400 nm and an optical path length of 1 cm through the solution is preferably 30% or more, and more preferably 40% or more. If the transmittance of light at a wavelength of 400 nm is 30% or more, the resultant polyimide is excellent in light transmittance.

In the present invention, it is preferable that a polyimide precursor solution composition contain at least the polyimide precursor of the present invention and a solvent, and the sum of tetracarboxylic acid component and diamine component is 5 mass % or more, preferably 10 mass % or more, and more preferably 15 mass % or more based on the total amount of solvent, tetracarboxylic acid component and diamine component. Note that, it is preferable that the ratio be usually 60 mass % or less, and preferably 50 mass % or less. The concentration is close to the concentration of a solid substance ascribed to a polyimide precursor. If the concentration is extremely low, it becomes difficult to control the thickness of a polyimide film obtained for example when a polyimide film is produced.

As a solvent used for the polyimide precursors of the present invention, those capable of dissolving the polyimide precursors are used without any problem and the structure thereof is not limited. The examples preferably used include amide solvents such as N, N-dimethylformamide, N, N-dimethylacetamide and N-methylpyrrolidone; cyclic ester solvents such as γ-butyrolactone, γ-valerolactone, δ-valerolactone, γ-caprolactone, ε-caprolactone, and α-methyl-γ-butyrolactone; carbonate solvents such as ethylene carbonate and propylene carbonate; glycol-based solvents such as triethylene glycol; phenol-based solvents such as m-cresol, p-cresol, 3-chlorophenol and 4-chlorophenol; acetophenone, 1,3-dimethyl-2-imidazolidinone, sulfolane, dimethylsulfoxide and water. In addition, other common organic solvents, for example, phenol, o-cresol, butyl acetate, ethyl acetate, isobutyl acetate, propyleneglycol methyl acetate, ethyl cellosolve, butyl cellosolve, 2-methylcellosolve acetate, ethylcellosolve acetate, butylcellosolve acetate, tetrahydrofuran, dimethoxyethane, diethoxyethane, dibutyl ether, diethylene glycol dimethyl ether, methyl isobutyl ketone, diisobutyl ketone, cyclopentanone, cyclohexanone, methyl ethyl ketone, acetone, butanol, ethanol, xylene, toluene, chlorobenzene, turpentine, mineral spirits, and petroleum naphtha-based solvents may be used. Furthermore, these may be used in combination of two or more.

In the present invention, the viscosity of a polyimide precursor solution composition (rotatory viscosity) is not particularly limited; however, the rotatory viscosity, which is measured by an E-type rotatory viscometer at a temperature of 25° C. and at a shearing rate of 20 sec$^{-1}$, is preferably 0.01 to 1000 Pa·sec, and more preferably 0.1 to 100 Pa·sec. Furthermore, if necessary, thixotropy can be imparted. In the above viscosity range, the composition is easily handled in coating and forming a film. In addition, since repulsion is suppressed and leveling property is excellent, a satisfactory film can be obtained.

To the polyimide precursor solution composition of the present invention, if necessary, a chemical imidizing agent (an acid anhydride such as acetic anhydride, an amine compound such as pyridine and isoquinoline), an antioxidant, a filler, a dye, a pigment, a coupling agent such as a silane coupling agent, a primer, a flame retardant, a defoaming agent, a leveling agent, a rheology control agent (auxiliary flowability control agent), a remover and the like can be added.

The polyimide of the present invention is characterized in that a repeating unit represented by the above chemical formula (5) is contained as a constituent. The polyimide of the present invention can be suitably produced by a ring closure reaction (imidization reaction) of the polyimide precursor of the present invention as mentioned above. The imidization method is not particularly limited. A heat imidization or chemical imidization method known in the art can be suitably applied. The preferred form of the polyimide obtained may be, for example, a film, a laminate of a polyimide film and a substrate, a coating film, a powder, beads, a compact, a foam product and vanish.

The polyimide of the present invention has excellent light transmittance, and although it is not particularly limited, the total light transmittance (average transmittance of light having a wavelength 380 nm to 780 nm) of a film formed of the polyimide having a thickness of 10 μm, is preferably 70% or more, more preferably 80% or more, and particularly preferably 85% or more.

The polyimide of the present invention has excellent transparency, and although it is not particularly limited, the transmittance of light at a wavelength of 400 nm when formed into a film with a thickness of 10 μm is preferably 50% or more, more preferably 60% or more, more preferably 70% or more, particularly preferably 75% or more.

Furthermore, the polyimide of the present invention has an extremely low coefficient of linear thermal expansion, and although it is not particularly limited, the average coefficient of linear thermal expansion of a film formed thereof is preferably 50 ppm/K or less, more preferably 40 ppm/K or less, and particularly preferably 20 ppm/K or less at 50° C. to 200° C.

The polyimide of the present invention has excellent flame resistance. The oxygen index of a film formed of the polyimide and obtained in accordance with JIS K 7201 is 22% (volume fraction) or more and more preferably 24% (volume fraction) or more. Although it is not particularly limited, the polyimide of the present invention having high flame resistance is obtained from a polyimide precursor (B). "A" in the above chemical formula (5) represents an aliphatic tetravalent group and "B" is preferably a divalent group having at least one chemical structure represented by the above chemical formula (2) in the chemical structure.

By the way, the film thickness of a film formed of the polyimide of the present invention, which varies depending upon the use, is preferably about 1 μm to 250 μm, and further preferably about 1 μm to 150 μm.

The polyimide of the present invention has excellent properties such as transparency, bending resistance and high heat resistance, and furthermore has an extremely low coefficient of linear thermal expansion and excellent solvent resistance, or excellent solvent resistance and flame resistance together. Thus, the polyimide of the present invention can be suitably used as transparent substrates for displays, touch panels or as substrates for solar batteries.

Now, a method for producing a polyimide film/substrate laminate or a polyimide film using the polyimide precursor of the present invention will be described below; however the method is not limited to the following method.

The polyimide precursor solution composition of the present invention is cast onto a base material such as a ceramic (glass, silicon, alumina), a metal (copper, aluminum, stainless steel), or a thermally stable plastic film (polyimide) and is dried in a temperature range of 20 to 180° C., preferably 20 to 150° C., with hot air or infrared radiation in vacuum, in an inert gas such as nitrogen, or in the air. Subsequently, the resulting polyimide precursor film is heated for imidization on the base material or in a state peeled from the base material and fixed at the ends at 200 to 500° C., more preferably about 250 to 450° C., with hot air or infrared radiation in vacuum, in an inert gas such as nitrogen, or in the air. Thus, a polyimide film/base material laminate or a polyimide film can be produced. The thermal imidization in vacuum or in an inert gas is desirable for preventing oxidative degradation of the resulting polyimide film. If the temperature for the thermal imidization is not too high, thermal imidization in the air is allowable. The thickness of the polyimide film (in the case of the polyimide film/base material laminate, the polyimide film layer) is preferably 1 to 250 µm, more preferably 1 to 150 µm, for the transportability in the subsequent steps.

The imidization of the polyimide precursor may be also performed by chemical treatment by, for example, immersing the polyimide precursor in a solution containing a cyclodehydrating agent such as acetic anhydride in the presence of a tertiary amine such as pyridine or triethylamine, instead of the thermal imidization by heat treatment as described above. In addition, a partially imidized polyimide precursor may be produced by stirring a polyimide precursor solution composition containing a cyclodehydrating agent in advance, casting the mixture onto a base material, and drying it. The partially imidized polyimide precursor can be formed into a polyimide film/base material laminate or a polyimide film by the heat treatment described above.

The thus-prepared polyimide film/base material laminate or polyimide film can be formed into a flexible conductive substrate by forming a conductive layer on one surface or both surfaces of the laminate or the film.

The flexible conductive substrate can be prepared by, for example, the following methods. That is, in a first method, a conductive laminate of (conductive layer)/(polyimide film)/(base material) is produced by forming a conductive layer of a conductive material (e.g., a metal, a metal oxide, a conductive organic material, or conductive carbon) on the polyimide film surface of the (polyimide film)/(base material) laminate without peeling the polyimide film from the substrate by, for example, sputtering deposition or printing. Subsequently, the (electrically conductive layer)/(polyimide film) laminate is peeled from the base material as necessary to provide a transparent and flexible conductive substrate composed of conductive layer/polyimide film laminate.

In a second method, the polyimide film is peeled off from the base material of a (polyimide film)/(base material) laminate to provide a polyimide film, and a conductive layer of a conductive material (e.g., a metal, a metal oxide, a conductive organic material, or conductive carbon) is formed on the polyimide film surface as in the first method to provide a transparent and flexible conductive substrate composed of (conductive layer)/(polyimide film) laminate.

In the first and the second methods, a gas-barrier layer against water vapor, oxygen, etc. or an inorganic layer such as a light controlling layer may be optionally formed by, for example, sputtering deposition or a gel-sol method before the formation of the conductive layer on the polyimide film surface.

Furthermore, a circuit is suitably formed on the conductive layer by a method such as photolithography, various printing methods, or ink-jetting.

The substrate of the present invention includes the circuit of the conductive layer on the surface of a polyimide film formed from the polyimide of the present invention, if necessary via a gas-barrier layer or an inorganic layer. The substrate is flexible and has excellent transparency, bending resistance, and heat resistance and also has a considerably low coefficient of linear thermal expansion and high solvent resistance. Therefore, a fine circuit can be readily formed. Accordingly, the substrate can be suitably used as a substrate for a display, touch panel, or solar cell.

That is, a flexible thin-film transistor is produced by further forming a transistor (inorganic transistor or organic transistor) on the substrate by a method such as deposition, various printing methods, or ink-jet method and is suitably used as a liquid crystal device for a display device, EL device, or photoelectric device.

EXAMPLES

The present invention will now be described in more detail based on the following examples and comparative examples. However, the present invention is not limited to the following examples.

In each of the following examples, evaluation was carried out based on the following methods.

<Evaluation of Tetracarboxylic Component and Diamine Component>

[Light Transmittance]

As for tetracarboxylic components, a predetermined amount of tetracarboxylic components was dissolved in a solvent (2 N aqueous solution of sodium hydroxide) to obtain a 10 mass % solution. As for diamine components, a predetermined amount of diamine components was dissolved in a solvent (methanol) to obtain an 8 mass % solution. Using a MCPD-300 manufactured by Otsuka Electronics Co., Ltd., and a standard cell having a light path length of 1 cm, the light transmittance at 400 nm of the prepared solutions of the diamine components and the tetracarboxylic components was measured using the measurement solvent as a blank.

<Evaluation of Solvent>

[GC Analysis: Solvent Purity]

The solvent purity was measured under the following conditions using a GC-2010 manufactured by Shimadzu Corporation. The purity (GC) was determined from the peak surface area fraction.

Column: DB-FFAP manufactured by J&W, 0.53 mm ID×30 m

Temperature: 40° C. (5 minutes holding)+40° C. to 250° C. (10 minutes/minutes)+250° C. (9 minutes holding)

Inlet temperature: 240° C.

Detector temperature: 260° C.

Carrier gas: Helium (10 ml/minute)

Injection amount: 1 µL

[Non-Volatile Content]

5 g of solvent was weighed in a glass vessel and heated at 250° C. for 30 minutes in a hot air circulating oven. The vessel was cooled and the residual matter was weighed. From the mass of the residual matter, the non-volatile content (mass %) in the solvent is determined.

[Light Transmittance and Light Transmittance after Heating with Refluxing]

Using a MCPD-300 manufactured by Otsuka Electronics Co., Ltd., and a standard cell having a light path length of 1 cm, the light transmittance of a solvent at 400 nm was measured using water as a blank.

As for light transmittance after heating with refluxing, light transmittance at 400 nm was measured for a solvent that had been heated to reflux for 3 hours under nitrogen atmosphere having oxygen concentration of 200 ppm or less.

[Quantification of Metal Component]

The metal content contained in the solvent was quantified based on inductively coupled plasma mass spectrometry (ICP-MS) using an Elan DRC II manufactured by PerkinElmer Inc.

<Evaluation of Polyimide Precursor Solution Composition>

[Concentration of Solid Content]

One gram of polyimide precursor solution composition was weighed into an aluminum dish, heated for 2 hours in a 200° C. hot air circulating oven to remove the non-solid content. The concentration of solid content (mass %) was determined from the residual matter.

[Rotational Viscosity]

The viscosity of the polyimide precursor solution at a temperature of 25° C. and a shear rate of 20 sec$^{-1}$ was determined using a TV-22 E-type rotary viscometer manufactured by Toki Sangyo Co., Ltd.

[Logarithmic Viscosity]

The logarithmic viscosity was determined by measuring a 0.5 g/dL solution of the polyimide precursor in N,N-dimethylacetamide at 30° C. using an Ubbelohde viscometer.

[Light Transmittance]

The polyimide precursor was diluted with N,N-dimethylacetamide so as to form a 10 mass % polyimide precursor solution. Then, using the prepared solutions and using a MCPD-300 manufactured by Otsuka Electronics Co., Ltd., and a standard cell having a light path length of 1 cm, the light transmittance at 400 nm of the 10 mass % polyimide precursor solution was measured using N,N-dimethylacetamide as a blank.

<Evaluation of Polyimide Film>

[Light Transmittance]

The light transmittance at 400 nm and total light transmittance (average light transmittance from 380 nm to 780 nm) of a polyimide film with a thickness of 10 μm were measured using a MCPD-300 manufactured by Otsuka Electronics Co., Ltd.

[Elastic Modulus and Elongation at Break]

The initial elastic modulus and elongation at break for a chuck interval of 30 mm and a tension rate of 2 mm/min were measured using a Tensilon manufactured by Orientec Co., Ltd., on a test piece produced by punching a polyimide film with a thickness of 10 μm into an IEC450 standard dumbbell shape.

[Coefficient of Thermal Expansion (CTE)]

A test piece was produced by cutting a polyimide film with a thickness of 10 μm into a strip with a width of 4 mm. Then, using a TMA-50 manufactured by Shimadzu Corporation, the temperature of the test piece was increased to 300° C. at a rate of temperature increase of 20° C./min with a chuck interval of 15 mm and a load of 2 g. The average coefficient of thermal expansion from 50° C. to 200° C. was determined from the obtained TMA curve.

[Bending Resistance]

A test piece was produced by cutting a polyimide film with a thickness of 10 μm into a strip with a width of 4 mm. The test piece was bent with a curvature radius of 1 mm under the conditions of a temperature of 25° C. and a humidity of 50% RH. The resultant test pieces were visually observed. A test piece having no abnormality was indicated by ○ (good) and a test piece having a crack was indicated by x (bad).

[Solvent Resistance]

A polyimide film having a thickness of about 10 μm was soaked in N,N-dimethylacetamide under the conditions of a temperature of 25° C. for one hour and thereafter, the state of the film was visually observed. A test piece having no abnormality was indicated by ○ (good); a test piece having wrinkle or partly having a change of shape was indicated by Δ (medium), and a test piece dissolved or having a significant change of shape was indicated by x (bad).

[5% Weight Loss Temperature]

A polyimide film having a thickness of about 10 μm was used as a test piece. The temperature of the test piece was increased from 25° C. to 600° C. by use of a differential thermogravity/thermogravity simultaneous measuring apparatus (TG/DTA6300) manufactured by SII Nano Technology Inc., under a nitrogen flow at a temperature raising rate of 10° C./min. From the obtained weight curve, 5% weight loss temperature was obtained.

[Oxygen Index]

A polyimide film having a thickness of about 30 μm was used as a test piece. Oxygen index of the test piece was obtained by a method (test piece shape: V type, 140 mm×52 mm×about 30 μm) in accordance with JIS K 7201 using a candle combustion tester D-type manufactured by Toyo Seiki Seisaku-sho, Ltd.

Abbreviation and purity and the like of the raw materials used in the respective following examples are as follows.

[Diamine Component]

DABAN: 4,4'-diaminobenzanilide; purity 99.90% (GC analysis).

4-APTP: N,N'-bis (4-aminophenyl)terephthalamide; purity 99.95% (GC analysis).

ODA: 4,4'-oxydianiline; purity 99.9% (GC analysis).

PPD: p-phenylene diamine purity 99.9% (GC analysis).

TFMB: 2,2'-bis(trifluoromethyl)benzidine; purity 99.83% (GC analysis).

BABA: N,N'-p-phenylene bis(p-aminobenzamide); purity 99% (GC analysis).

AZDA: 2,4-bis (4-aminoanilino)-6-anilino-1,3,5-triazine; purity 99.9% (GC analysis).

BABB: 1,4-Bis(4-aminobenzoyloxy)benzene; purity 99.8% (GC analysis).

[Tetracarboxylic Acid Component]

PMDA-HS: 1R,2S,4S,5R-Cyclohexane tetracarboxylic dianhydride; purity (as PMDA-HS) 92.7% (GC analysis); purity (as hydrogenated pyromellitic dianhydride) 99.9% (GC analysis).

BPDA-H: 3,3',4,4'-bicyclohexyltetracarboxylic dianhydride; purity (as mixture of stereoisomers) 99.9% (GC analysis).

cis/cis-BTA-H: 1rC7-bicyclo[2.2.2]octane-2c,3c,5c,6c-tetracarboxylic-2,3:5,6-dianhydride; purity (as cis/cis-BTA-H) 99.9% (GC analysis).

DNDAxx: (4arH,8acH)-decahydro-1t,4t:5c,8c-dimethano naphthalene-2t,3t,6c,7c-tetracarboxylic dianhydride; purity (as DNDAxx) 99.2% (GC analysis).

DNDAdx: (4arH,8acH)-decahydro-1t,4t:5c,8c-dimethano naphthalene-2c,3c,6c,7c-tetracarboxylic dianhydride; purity (as DNDAdx) 99.7% (GC analysis).

[Transmittance of Diamine and Acid Dianhydride]

TABLE 2

| | | solvent | Concentration (mass %) | 400 nm light transmittance (%) |
|---|---|---|---|---|
| Diamine | DABAN | methanol | 8 | 35 |
| | PPD | methanol | 8 | 61 |
| | TFMB | methanol | 8 | 99 |
| acid dianhydride | cis/cis-BTA-H | 2N NaOH | 10 | 100 |
| | DNDAxx | 2N NaOH | 10 | 70 |
| | DNDAdx | 2N NaOH | 10 | 100 |

[Silylating Agent]
BSA: N,O-bis(trimethylsilyl)acetamide
[Solvent]
DMAc: N, N-dimethylacetamide
[Purity of Solvent (N, N-dimethylacetamide)]
GC Analysis

| | |
|---|---|
| Retention time of main component (min) | 14.28 |
| Area of main component (%) | 99.9929 |
| Peak area of impurity having shorter retention time (%) | 0.0000 |

-continued

| | |
|---|---|
| Peak area of impurity having longer retention time (%) | 0.0071 |
| Non-volatile Content (mass %) | <0.001 |

Light Transmittance:

| | |
|---|---|
| Light transmittance at 400 nm (%) | 92 |
| Light transmittance at 400 nm after reflux (%) | 92 |

Metal Content:

| | |
|---|---|
| Na (ppb) | 150 |
| Fe (ppb) | <2 |
| Cu (ppb) | <2 |
| Mo (ppb) | <1 |

Table 3 shows the structural formulae of the tetracarboxylic acid components and diamine components used in Examples and Comparative examples.

TABLE 3

Diamine component

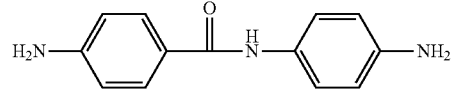

DABAN

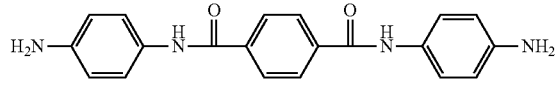

4-APTP

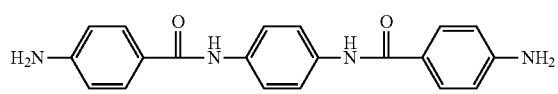

BABA

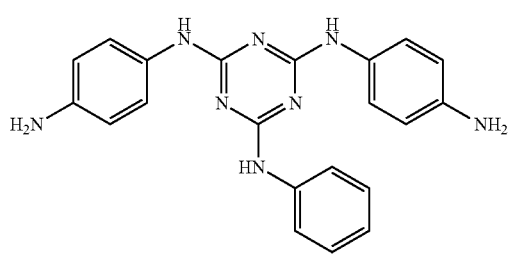 [SMILES: Nc1ccc(Nc2nc(Nc3ccccc3)nc(Nc3ccc(N)cc3)n2)cc1]

AZDA

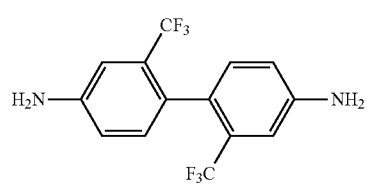

TFMB

TABLE 3-continued

PPD

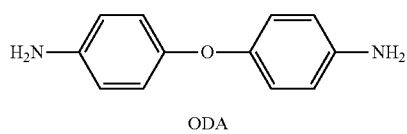

ODA

Tetracarboxylic acid component

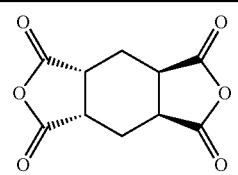

PMDA-HS

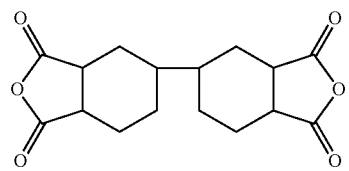 [SMILES: O=C1OC(=O)C2CC(C3CCC4C(=O)OC(=O)C4C3)CCC12]

BPDA-H

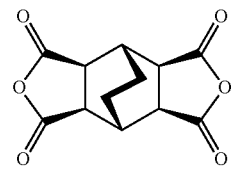

cis/cis-BTA-H

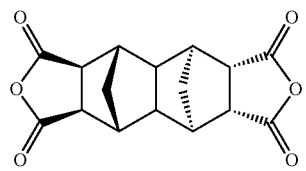 [SMILES: O=C1OC(=O)[C@H]2[C@@H]1[C@H]1C[C@@H]2C2C1[C@@H]1C[C@H]2[C@H]2C(=O)OC(=O)[C@H]21]

DNDAxx

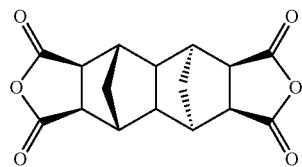 [SMILES: O=C1OC(=O)[C@H]2[C@@H]1[C@@H]1C[C@H]2C2C1[C@H]1C[C@@H]2[C@@H]2C(=O)OC(=O)[C@@H]21]

DNDAdx

Example 1

In a reaction vessel purged with nitrogen gas, 2.27 g (10 mmol) of DABAN was charged and dissolved in 25.55 g of N,N-dimethylacetamide such an amount that the feeding amount of monomers (total amount of diamine component and carboxylic acid component) is 15% by mass and stirred at 50° C. for 2 hours. To the solution, 2.23 g (10 mmol) of PMDA-HS was gradually added. The solution was stirred at 50° C. for 6 hours to obtain a uniform and viscous polyimide precursor solution.

Measurement results of properties of the polyimide precursor solution are shown in Table 4-1.

The polyimide precursor solution that was filtered using a PTFE membrane filter was applied on a glass substrate, and thermally imidized by heating at 120° C. for 1 hour, at 150° C. for 30 minutes, at 200° C. for 30 minutes, then heating up and at 350° C. for 5 minutes while holding it on the substrate under nitrogen atmosphere (oxygen concentration is 200 ppm or less) to obtain a colorless transparent polyimide/glass laminate. Thus obtained polyimide/glass laminate was immersed in water for delamination to obtain a polyimide film with thickness of about 10 μm.

Measurement results of properties of the polyimide film are shown in Table 4-1.

Examples 2 to 51

Polyimide precursor solutions and polyimide films were obtained in the same manner as Example 1 except that diamine component and carboxylic acid component were selected as indicated in Table 4-1, and N,N-dimethylacetamide is used in such an amount that the feeding amount of monomers (total amount of diamine component and carboxylic acid component) is 15% by mass.

Measurement results of properties of the polyimide precursor solutions and polyimide films are shown in Table 4-1.

Example 6

In a reaction vessel purged with nitrogen gas, 2.27 g (10 mmol) of DABAN was charged and dissolved in 21.16 g of N,N-dimethylacetamide such an amount that the feeding amount of monomers (total amount of diamine component and carboxylic acid component) is 20% by mass and stirred at 50° C. for 2 hours. To the solution, 2.11 g (7 mmol) of DNDAxx and 0.91 g (3 mmol) of DNDAdx were gradually added. The solution was stirred at 50° C. for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-1.

Example 7

In a reaction vessel purged with nitrogen gas, 2.27 g (10 mmol) of DABAN was charged and dissolved in 21.16 g of N,N-dimethylacetamide such an amount that the feeding amount of monomers (total amount of diamine component and carboxylic acid component) is 20% by mass and stirred at 50° C. for 2 hours. To the solution, 3.02 g (10 mmol) of DNDAxx was gradually added. The solution was stirred at 50° C. for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-1.

Example 8

In a reaction vessel purged with nitrogen gas, 2.27 g (10 mmol) of DABAN was charged and dissolved in 18.06 g of N,N-dimethylacetamide such an amount that the feeding amount of monomers (total amount of diamine component and carboxylic acid component) is 20% by mass and stirred at room temperature for 1 hour. To the solution, 4.07 g (20 mmol) of BSA was added and stirred at room temperature for 3 hours. To the solution, 2.24 g (10 mmol) of PMDA-HS was gradually added. The solution was stirred at room temperature for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-1.

Example 9

In a reaction vessel purged with nitrogen gas, 2.05 g (9 mmol) of DABAN and 0.11 g (1 mmol) of PPD were charged and dissolved in 17.45 g of N,N-dimethylacetamide such an amount that the feeding amount of monomers (total amount of diamine component and carboxylic acid component) is 20% by mass and stirred at room temperature for 1 hour. To the solution, 2.24 g (10 mmol) of PMDA-HS was gradually added. The solution was stirred at room temperature for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-1.

Example 10

In a reaction vessel purged with nitrogen gas, 2.05 g (9 mmol) of DABAN and 0.32 g (1 mmol) of TFMB were charged and dissolved in 18.04 g of N,N-dimethylacetamide such an amount that the feeding amount of monomers (total amount of diamine component and carboxylic acid component) is 20% by mass and stirred at room temperature for 1 hour. To the solution, 2.24 g (10 mmol) of PMDA-HS was gradually added. The solution was stirred at room temperature for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-1.

Example 11

In a reaction vessel purged with nitrogen gas, 3.46 g (10 mmol) of 4-APTP was charged and dissolved in 25.29 g of N,N-dimethylacetamide such an amount that the feeding amount of monomers (total amount of diamine component and carboxylic acid component) is 20% by mass and stirred at 50° C. for 2 hours. To the solution, 3.02 g (10 mmol) of DNDAxx was gradually added. The solution was stirred at 50° C. for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-2.

Example 12

In a reaction vessel purged with nitrogen gas, 2.27 g (10 mmol) of DABAN was charged and dissolved in 21.16 g of N,N-dimethylacetamide such an amount that the feeding amount of monomers (total amount of diamine component and carboxylic acid component) is 20% by mass and stirred at 50° C. for 2 hours. To the solution, 3.02 g (10 mmol) of DNDAxx was gradually added. The solution was stirred at 50° C. for 6 hours to obtain a uniform and viscous polyimide precursor solution. To the solution, 4.07 g (20 mmol) of BSA was added and stirred for 12 hours. The formation of film was carried out as described in Example 1 to provide a polyimide film.

Measurement results of properties of the polyimide precursor solutions and polyimide films are shown in Table 4-2.

Example 13

In a reaction vessel purged with nitrogen gas, 3.46 g (10 mmol) of 4-APTP was charged and dissolved in 36.72 g of N,N-dimethylacetamide such an amount that the feeding amount of monomers (total amount of diamine component and carboxylic acid component) is 15% by mass and stirred at 50° C. for 2 hours. To the solution, 3.02 g (10 mmol) of DNDAxx was gradually added. The solution was stirred at 50° C. for 6 hours to obtain a uniform and viscous polyimide precursor solution. To the solution, 2.03 g (10 mmol) of BSA was added and stirred for 12 hours. The formation of film was carried out as described in Example 1 to provide a polyimide film.

Measurement results of properties of the polyimide precursor solutions and polyimide films are shown in Table 4-2.

Example 14

In a reaction vessel purged with nitrogen gas, 1.59 g (7 mmol) of DABAN and 0.32 g (3 mmol) of PPD were charged and dissolved in 19.85 g of N,N-dimethylacetamide such an amount that the feeding amount of monomers (total amount of diamine component and carboxylic acid component) is 20% by mass and stirred at room temperature for 1 hour. To the solution, 3.02 g (10 mmol) of DNDAxx was gradually added. The solution was stirred at room temperature for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-2.

Example 15

In a reaction vessel purged with nitrogen gas, 1.59 g (7 mmol) of DABAN and 0.96 g (3 mmol) of TFMB were charged and dissolved in 22.59 g of N,N-dimethylacetamide such an amount that the feeding amount of monomers (total amount of diamine component and carboxylic acid component) is 20% by mass and stirred at room temperature for 1 hour. To the solution, 3.02 g (10 mmol) of DNDAxx was gradually added. The solution was stirred at room temperature for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-2.

Example 16

In a reaction vessel purged with nitrogen gas, 2.42 g (7 mmol) of 4-APTP and 0.32 g (3 mmol) of PPD were charged and dissolved in 21.79 g of N,N-dimethylacetamide such an amount that the feeding amount of monomers (total amount of diamine component and carboxylic acid component) is 20% by mass and stirred at room temperature for 1 hour. To the solution, 3.02 g (10 mmol) of DNDAxx was gradually added. The solution was stirred at room temperature for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-2.

Example 17

In a reaction vessel purged with nitrogen gas, 1.59 g (7 mmol) of DABAN and 0.32 g (3 mmol) of PPD were charged and dissolved in 19.75 g of N,N-dimethylacetamide such an amount that the feeding amount of monomers (total amount of diamine component and carboxylic acid component) is 20% by mass and stirred at room temperature for 1 hour. To the solution, 3.02 g (10 mmol) of DNDAxx was gradually added. The solution was stirred at room temperature for 6 hours to obtain a uniform and viscous polyimide precursor solution. To the solution, 4.07 g (20 mmol) of BSA was added and stirred for 12 hours. The formation of film was carried out as described in Example 1 to provide a polyimide film.

Measurement results of properties of the polyimide precursor solutions and polyimide films are shown in Table 4-2.

Example 18

In a reaction vessel purged with nitrogen gas, 3.46 g (10 mmol) of BABA was charged and dissolved in 25.94 g of N,N-dimethylacetamide such an amount that the feeding amount of monomers (total amount of diamine component and carboxylic acid component) is 20% by mass and stirred at room temperature for 1 hour. To the solution, 3.02 g (10 mmol) of DNDAxx was gradually added. The solution was stirred at room temperature for 6 hours to obtain a uniform and viscous polyimide precursor solution. The formation of film was carried out as described in Example 1 to provide a polyimide film.

Measurement results of properties of the polyimide precursor solutions and polyimide films are shown in Table 4-2.

Comparative Examples 1 to 4

Polyimide precursor solutions and polyimide films were obtained in the same manner as Example 1 except that diamine components and carboxylic acid components were selected as indicated in Table 4-2, and N,N-dimethylacetamide is used in such an amount that the feeding amount of monomers (total amount of diamine component and carboxylic acid component) is 15% by mass for Comparative examples 1 and 2 and 20% by mass for Comparative examples 3 and 4.

Measurement results of properties of the polyimide precursor solutions and polyimide films are shown in Table 4-2.

TABLE 4-1

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Formulation of Polyimide Precursor (mol %) | | | | | | | | | | | |
| Tetracarboxylic acid component | PMDA-HS | 100 | 100 | | | | | | 100 | 100 | 100 |
| | BPDA-H | | | 100 | | | | | | | |
| | cis/cisBTA-H | | | | 100 | 100 | | | | | |
| | DNDAdx | | | | | | 30 | | | | |
| | DNDAxx | | | | | | 70 | 100 | | | |
| Diamine component | DABAN | 100 | | | | | 100 | 100 | 100 | 90 | 90 |
| | 4-APTP | | 100 | 100 | 100 | | | | | | |
| | BABA | | | | | | | | | | |
| | PPD | | | | | | | | | 10 | |
| | TFMB | | | | | | | | | | 10 |
| | ODA | | | | | | | | | | |
| Silylating agent | BSA | | | | | | | | 200 | | |
| Properties of Polyimide Precursor solution composition | | | | | | | | | | | |
| Concentration of Solid Content (mass %) | | 14 | 14 | 14 | 14 | 17 | 21 | 20 | 17 | 20 | 20 |
| Rotational Viscosity (Pa sec) | | 0.4 | 39 | 42 | 26 | 0.7 | 2.9 | 7.7 | 0.4 | 13.1 | 20.9 |
| Logarithmic Viscosity (dL/g) | | 0.6 | 1.58 | 1.62 | 1.37 | 0.44 | 0.5 | 0.58 | 0.4 | 0.9 | 0.8 |
| Light Transmittance at 400 nm (%) | | | | | | | | 43 | | | |
| Properties of Polyimide Film | | | | | | | | | | | |
| Light Transmittance at 400 nm (%) | | 84 | 60 | 80 | 52 | 88 | 74 | 78 | 71 | 82 | 83 |
| Whole Light Transmittance (%) | | 88 | 86 | 86 | 82 | 88 | 86 | 88 | 73 | 87 | 85 |
| Elastic Modulus (Gpa) | | 4.4 | 5.7 | 3.9 | 5.8 | 4.6 | 3.3 | 4.0 | 4.0 | 3.9 | 3.7 |
| Elongation at break (%) | | 35 | 18 | 71 | 4 | 3 | 9 | 4 | 39 | 39 | 32 |
| CTE (ppm/K) | | 36 | 16 | 44 | 12 | 33 | 49 | 39 | 50 | 46 | 49 |
| Bending Resistance | | ○ | ○ | ○ | ○ | ○ | ○ | ○ | ○ | ○ | ○ |
| Solvent Resistance | | ○ | ○ | ○ | ○ | ○ | ○ | ○ | ○ | ○ | ○ |
| 5% Weight Loss Temperature (° C.) | | 439 | 432 | 468 | 476 | 509 | 515 | 523 | 444 | 453 | 438 |

TABLE 4-2

|  |  | Example 11 | Example 12 | Example 13 | Example 14 | Example 15 | Example 16 | Example 17 | Example 18 | Comp. Ex. 1 | Comp. Ex. 2 | Comp. Ex. 3 | Comp. Ex. 4 |
|---|---|---|---|---|---|---|---|---|---|---|---|---|---|
| Formulation of Polyimide Precursor (mol %) | | | | | | | | | | | | | |
| Tetracarboxylic acid component | PMDA-HS | | | | | | | | | 100 | | | |
| | BPDA-H | | | | | | | | | | 100 | | |
| | cis/cisBTA-H | | | | | | | | | | | 100 | |
| | DNDAdx | | | | | | | | | | | | |
| | DNDAxx | 100 | 100 | 100 | 100 | 100 | 100 | 100 | 100 | | | | 100 |
| Diamine component | DABAN | | 100 | | 70 | 70 | | 70 | | | | | |
| | 4-APTP | 100 | | 100 | | | 70 | | | | | | |
| | BABA | | | | | | | | 100 | | | | |
| | PPD | | | | 30 | | 30 | 30 | | | | | |
| | TFMB | | | | | 30 | | | | | | | |
| | ODA | | | | | | | | | 100 | 100 | 100 | 100 |
| Silylating agent | BSA | | 200 | 100 | | | | 200 | | | | | |
| Properties of Polyimide Precursor solution composition | | | | | | | | | | | | | |
| Concentration of Solid Content (mass %) | | 20 | 21 | 11 | 19 | 22 | 21 | | 24 | 17 | 14 | 22 | 20 |
| Rotational Viscosity (Pa sec) | | 141.0 | 7.4 | 1.1 | 2.9 | 4.0 | 1.3 | | 49.5 | 27 | 0.3 | 2.4 | 3.5 |

TABLE 4-2-continued

|  | Example 11 | Example 12 | Example 13 | Example 14 | Example 15 | Example 16 | Example 17 | Example 18 | Comp. Ex. 1 | Comp. Ex. 2 | Comp. Ex. 3 | Comp. Ex. 4 |
|---|---|---|---|---|---|---|---|---|---|---|---|---|
| Logarithmic Viscosity (dL/g) | 1.2 | 0.62 | 1.07 | 0.56 | 0.51 | 1.04 |  | 0.75 | 1.02 | 0.56 | 0.5 | 0.6 |
| Light Transmittance at 400 nm (%) |  |  |  | 43 | 53 |  |  |  |  |  |  |  |
| Properties of Polyimide Film |  |  |  |  |  |  |  |  |  |  |  |  |
| Light Transmittance at 400 nm (%) | 59 | 77 | 65 | 76 | 83 | 66 | 50 |  | 86 | 84 | 75 | 81 |
| Whole Light Transmittance (%) | 87 | 90 | 89 | 89 | 92 | 90 | 61 |  | 89 | 88 | 87 | 88 |
| Elastic Modulus (Gpa) | 5.8 | 4.6 | 6.5 | 3.8 | 3.6 | 4.3 | 3.5 |  | 3.1 | 2.2 | 1.7 | 2 |
| Elongation at break (%) | 4 | 9 | 10 | 7 | 13 | 13 | 6 |  | 73 | 10 | 8 | 27 |
| CTE (ppm/K) | 22 | 22 | 15 | 44 | 41 | 32 | 24 | 41 | 51 | 52 | 54 | 64 |
| Bending Resistance | ○ | ○ | ○ | ○ | ○ | ○ | ○ | ○ | ○ | ○ | ○ | ○ |
| Solvent Resistance | ○ | ○ | ○ | ○ | ○ | ○ | ○ | ○ | Δ | ○ | Δ | Δ |
| 5% Weight Loss Temperature (° C.) | 515 | 514 | 508 | 515 | 506 | 514 | 507 | 522 | 467 | 502 | 504 | 502 | note:
CTE: Coefficient of Linear Thermal Expansion

As can be seen from the results shown in Table 4, Examples 1 to 18 according to the present invention in which diamines having amide bonds) are used have smaller coefficient of linear thermal expansion and excellent solvent resistance compared with Comparative Examples 1 to 4.

In addition, in cases that a tetracarboxylic acid component having two six-membered ring structure is used (Example 3) or that a crosslinked cyclic type tetracarboxylic acid component in which carbon atoms constituting six-membered ring are chemically bonded to form another ring is used (Examples 4 and 5), the produced polyimides have higher 5% weight loss temperature and are therefore excellent in heat resistance compared with the case in which a tetracarboxylic acid component having one six-membered ring structure is used (Examples 1 and 2).

In addition, in cases that a polyalicyclic/crosslinked cyclic type tetracarboxylic acid component such as DNDAxx and DNDAdx (Examples 6 and 7) is used, the produced polyimides have further higher 5% weight loss temperature and are therefore excellent in heat resistance, compared with the cases in which a tetracarboxylic acid component having two six-membered ring structure is used (Example 3) or that a crosslinked cyclic type tetracarboxylic acid component in which carbon atoms constituting six-membered ring are chemically bonded to form another ring is used (Examples 4 and 5).

It can be seen that the use of silylating agent results in the increase in elongation at break or smaller coefficient of linear thermal expansion (Examples 8, 12, 13 and 17).

As described, the polyimides obtained from the polyimide precursors of the present invention have excellent light transmittance and bending resistance, and furthermore low coefficient of linear thermal expansion and excellent solvent resistance in combination. Therefore, they are suitably used as a transparent substrate that is colorless and transparent and capable of forming a fine circuit for use in displays and the like.

Example 19

In a reaction vessel purged with nitrogen gas, 3.84 g (10 mmol) of AZDA was charged and dissolved in 34.49 g of N,N-dimethylacetamide such an amount that the feeding amount of monomers (total amount of diamine component and carboxylic acid component) is 15% by mass and stirred at 50° C. for 2 hours.

To the solution, 2.24 g (10 mmol) of PMDA-HS was gradually added. The solution was stirred at 50° C. for 6 hours to obtain a uniform and viscous polyimide precursor solution.

Measurement results of properties of the polyimide precursor solution are shown in Table 5.

The polyimide precursor solution that was filtered using a PTFE membrane filter was applied on a glass substrate, and thermally imidized by heating at 120° C. for 1 hour, at 150° C. for 30 minutes, at 200° C. for 30 minutes, then heating up and at 350° C. for 5 minutes while holding it on the substrate under nitrogen atmosphere (oxygen concentration is 200 ppm or less) to obtain a colorless transparent polyimide/glass laminate. Thus obtained polyimide/glass laminate was immersed in water for delamination to obtain a polyimide film with thickness of about 10 μm.

Measurement results of properties of the polyimide films are shown in Table 5.

Example 20

In a reaction vessel purged with nitrogen gas, 3.84 g (10 mmol) of AZDA was charged and dissolved in 27.44 g of N,N-dimethylacetamide such an amount that the feeding amount of monomers (total amount of diamine component and carboxylic acid component) is 20% by mass and stirred at 50° C. for 2 hours.

To the solution, 3.02 g (10 mmol) of DNDAxx was gradually added. The solution was stirred at 50° C. for 6 hours to obtain a uniform and viscous polyimide precursor solution.

Measurement results of properties of the polyimide precursor solution and the polyimide film are shown in Table 5.

Example 21

In a reaction vessel purged with nitrogen gas, 3.84 g (10 mmol) of AZDA was charged and dissolved in 27.44 g of N,N-dimethylacetamide such an amount that the feeding amount of monomers (total amount of diamine component and carboxylic acid component) is 20% by mass and stirred at 50° C. for 2 hours.

To the solution, 3.02 g (10 mmol) of DNDAdx was gradually added. The solution was stirred at 50° C. for 6 hours to obtain a uniform and viscous polyimide precursor solution.

Measurement results of properties of the polyimide precursor solution and the polyimide film are shown in Table 5.

Comparative Example 5

In a reaction vessel purged with nitrogen gas, 2.00 g (10 mmol) of ODA was charged and dissolved in 16.98 g of N,N-dimethylacetamide such an amount that the feeding amount of monomers (total amount of diamine component and carboxylic acid component) is 20% by mass and stirred at 50° C. for 2 hours.

Measurement results of properties of the polyimide precursor solution and the polyimide film are shown in Table 5.

Comparative Example 7

In a reaction vessel purged with nitrogen gas, 2.00 g (10 mmol) of ODA was charged and dissolved in 20.08 g of N,N-dimethylacetamide such an amount that the feeding amount of monomers (total amount of diamine component and carboxylic acid component) is 20% by mass and stirred at 50° C. for 2 hours.

To the solution, 3.02 g (10 mmol) of DNDAdx was gradually added. The solution was stirred at 50° C. for 6 hours to obtain a uniform and viscous polyimide precursor solution.

Measurement results of properties of the polyimide precursor solution and the polyimide film are shown in Table 5.

TABLE 5

|  |  | Example 19 | Example 20 | Example 21 | Comp. Ex. 5 | Comp. Ex. 6 | Comp. Ex. 7 |
| --- | --- | --- | --- | --- | --- | --- | --- |
| Formulation of Polyimide Precursor (mol %) | | | | | | | |
| Tetracarboxylic acid component | PMDA-HS | 100 | | | 100 | | |
| | DNDAxx | | 100 | | | 100 | |
| | DNDAdx | | | 100 | | | 100 |
| Diamine component | AZDA | 100 | 100 | 100 | | | |
| | ODA | | | | 100 | 100 | 100 |
| Properties of Polyimide Precursor solution composition | | | | | | | |
| Concentration of Solid Content (mass %) | | 14 | 18.5 | 20.3 | 17 | 19.8 | 21.8 |
| Rotational Viscosity (Pa sec) | | 0.3 | 8.6 | 10.4 | 27.0 | 3.5 | 2.4 |
| Logarithmic Viscosity (dL/g) | | 0.6 | 0.61 | 0.78 | 1.02 | 0.62 | 0.49 |
| Light Transmittance at 400 nm (%) | | | 52 | | | | |
| Properties of Polyimide Film | | | | | | | |
| Light Transmittance at 400 nm (%) | | 76 | 77.522185 | 88 | 86 | 81 | 75 |
| Whole Light Transmittance (%) | | 89 | 86.254705 | 91 | 88 | 88 | 87 |
| Elastic Modulus (Gpa) | | 3.4 | 3.3 | 3.2 | 3.1 | 2 | 1.7 |
| Elongation at break (%) | | 20 | 8.4 | 14.6 | 73 | 8 | 27 |
| CTE (ppm/K) | | 42 | 49 | 50 | 51 | 64 | 54 |
| Bending Resistance | | ◯ | ◯ | ◯ | ◯ | ◯ | ◯ |
| Solvent Resistance | | ◯ | ◯ | ◯ | Δ | Δ | Δ |
| 5% Weight Loss Temperature (° C.) | | 492 | 487 | 480 | 467 | 502 | 504 |
| Oxygen Index (vol %) | | | 24.4 | | | 21.6 | | note:
CTE: Coefficient of Linear Thermal Expansion

To the solution, 2.24 g (10 mmol) of PMDA-HS was gradually added. The solution was stirred at 50° C. for 6 hours to obtain a uniform and viscous polyimide precursor solution.

Measurement results of properties of the polyimide precursor solution and the polyimide film are shown in Table 5.

Comparative Example 6

In a reaction vessel purged with nitrogen gas, 2.00 g (10 mmol) of ODA was charged and dissolved in 20.08 g of N,N-dimethylacetamide such an amount that the feeding amount of monomers (total amount of diamine component and carboxylic acid component) is 20% by mass and stirred at 50° C. for 2 hours.

To the solution, 3.02 g (10 mmol) of DNDAxx was gradually added. The solution was stirred at 50° C. for 6 hours to obtain a uniform and viscous polyimide precursor solution.

As can be seen from the results shown in Table 5, Examples 19 to 21 according to the present invention in which diamines having a chemical structure represented by formula (2) are used have smaller coefficient of linear thermal expansion and are excellent in solvent resistance, heat resistance and flame resistance (high oxygen index), compared with Comparative Examples 5 to 7.

Also, it is found that the use of polyalicyclic/crosslinked cyclic type tetracarboxylic acid component results in increase in the transparency at 400 nm (Examples 20 and 21).

Thus, the polyimides obtained from the polyimide precursors of the present invention have excellent light transmittance and bending resistance, and furthermore low coefficient of linear thermal expansion, excellent solvent resistance and flame resistance in combination. Therefore, they are suitably used as a transparent substrate that is colorless and transparent and capable of forming a fine circuit for use in displays and the like.

INDUSTRIAL APPLICABILITY

According to the present invention, there is provided a polyimide having excellent properties such as transparency, bending resistance and high heat resistance in combination with an extremely low coefficient of linear thermal expansion and excellent solvent resistance, and a precursor thereof. Furthermore, according to the present invention, there is provided a polyimide having excellent properties such as transparency, bending resistance and high heat resistance in combination with an extremely low coefficient of linear thermal expansion, excellent solvent resistance and flame resistance, and a precursor thereof. The polyimide obtained from the polyimide precursor and the polyimide have high transparency and a low coefficient of linear thermal expansion allowing a fine circuit to be easily formed, and solvent resistance in combination.

The invention claimed is:

1. A polyimide precursor comprising a repeating unit represented by the following chemical formula (1):

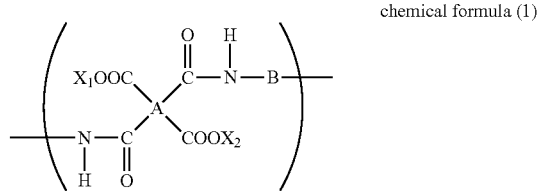

chemical formula (1)

wherein A is a tetravalent group having a plurality of aliphatic six-membered rings and no aromatic ring in the chemical structure, with the proviso that the plurality of six-membered rings may have two common carbon atoms as constituents, and B is at least one selected from the group consisting of the following chemical formulae (4-1) to (4-3):

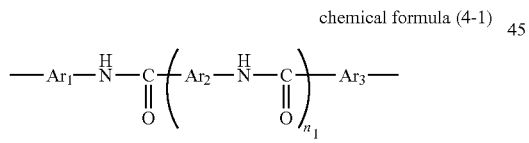

chemical formula (4-1)

wherein $Ar_1$, $Ar_2$ and $Ar_3$ are each independently a divalent group of benzene, biphenyl, terphenyl, naphthalene or anthracene, which may be substituted with $C_{1-3}$ alkyl group, halogen group, nitro group, hydroxyl group or carboxylic group, and n1 is an integer of 0 to 5;

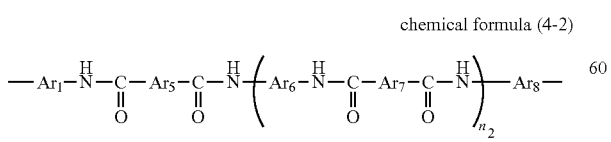

chemical formula (4-2)

wherein $Ar_4$, $Ar_5$, $Ar_6$, $Ar_7$ and $Ar_8$ are each independently a divalent group of benzene, biphenyl, terphenyl, naphthalene or anthracene, which may be substituted with $C_{1-3}$ alkyl group, halogen group, nitro group, hydroxyl group or carboxylic group, and n2 is an integer of 0 to 5;

wherein $Ar_9$, $Ar_{10}$, $Ar_{11}$, $Ar_{12}$ and $Ar_{13}$ are each independently a divalent group of benzene, biphenyl, terphenyl, naphthalene or anthracene, which may be substituted with $C_{1-3}$ alkyl group, halogen group, nitro group, hydroxyl group or carboxylic group, and n3 is an integer of 0 to 5; or

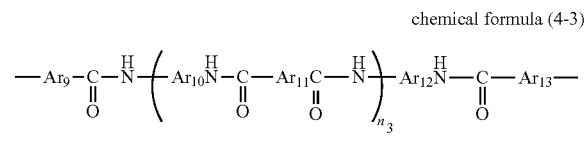

chemical formula (4-3)

wherein $Ar_9$, $Ar_{10}$, $Ar_{11}$, $Ar_{12}$ and $Ar_{13}$ are each independently a divalent group of benzene, biphenyl, terphenyl, naphthalene or anthracene, which may be substituted with $C_{1-3}$ alkyl group, halogen group, nitro group, hydroxyl group or carboxylic group, and n3 is an integer of 0 to 5; or B is a divalent group having at least one chemical structure represented by the following chemical formula (2) in the chemical structure:

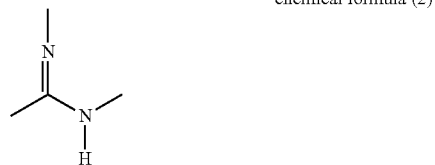

chemical formula (2)

and $X_1$ and $X_2$ are each independently hydrogen, a $C_{1-6}$ alkyl group or a $C_{3-9}$ alkylsilyl group.

2. The polyimide precursor according to claim 1, wherein the six-membered rings in A have a crosslinked cyclic form, in which carbon atoms constituting the ring chemically bind to each other to form another ring.

3. The polyimide precursor according to claim 1, wherein A is a group of the following chemical formula (3-2):

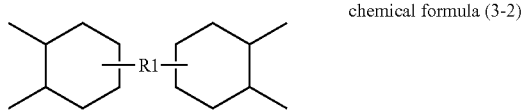

chemical formula (3-2)

wherein R1 is a direct bond, a $CH_2$ group, a $C(CH_3)_2$ group, an $SO_2$ group, an $Si(CH_3)_2$ group, a $C(CF_3)_2$ group, an oxygen atom or a sulfur atom.

4. The polyimide precursor according to claim 1, wherein A is a group of the following chemical formula (3-4):

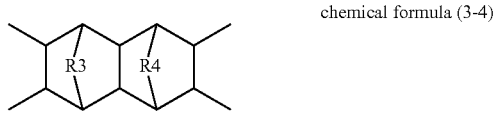

chemical formula (3-4)

wherein R3 and R4 are each independently a $CH_2$ group, a $CH_2CH_2$ group, an oxygen atom or a sulfur atom.

5. The polyimide precursor according to claim 1, wherein B is at least one selected from the group consisting of the chemical formulae (4-1) to (4-3).

6. The polyimide precursor according to claim 5, wherein Ar$_1$ to Ar$_{13}$ in the chemical formula (4-1) to (4-3) are each independently a benzyl or biphenyl divalent group.

7. The polyimide precursor according to claim 6, wherein the bonding position of benzene or biphenyl as Ar$_1$ to Ar$_{13}$ for forming a polyimide main chain is the para position.

8. The polyimide precursor according to claim 1, wherein B is a group of the following chemical formula (4-4):

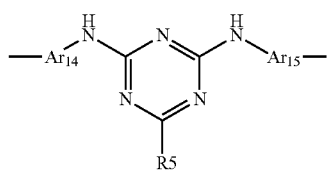

chemical formula (4-4)

wherein Ar$_{14}$ and Ar$_{15}$ are each independently a divalent aromatic group having 6 to 18 carbon atoms; and R5 is a hydrogen atom or a monovalent organic group.

9. The polyimide precursor according to claim 1, obtained from a tetracarboxylic acid component providing the repeating unit represented by chemical formula (1) in an amount of 70 mole % or more and other tetracarboxylic acid components in an amount of 30 mole % or less based on 100 mole % of the total tetracarboxylic acid components, and a diamine component providing the repeating unit represented by chemical formula (1) in an amount of 70 mole % or more and other diamine components in an amount of 30 mole % or less based on 100 mole % of the total diamine components.

10. The polyimide precursor according to claim 9, wherein the other diamine component is at least one selected from the group consisting of oxydianiline, p-phenylenediamine, m-phenylenediamine, benzidine, 3,3'-dimethylbenzidine, 2,2'-dimethylbenzidine, p-methylene bis(phenylenediamine), bis(aminophenoxy)benzene, bis[(aminophenoxy)phenyl]hexafluoropropane, bis(aminophenyl)hexafluoropropane, bis(aminophenyl)sulfone, bis(trifluoromethyl)benzidine, cyclohexane diamine, bis[(aminophenoxy)phenyl]propane, bis(aminohydroxyphenyl)hexafluoropropane, and bis[(aminophenoxy)diphenyl]sulfone.

11. The polyimide precursor according to claim 1, obtained from a tetracarboxylic acid component having a purity of 99% or more and a diamine component having a purity of 99% or more, wherein in the case that plural stereoisomers are contained, the purity is determined by regarding the stereoisomers as a single component without distinguishing them.

12. The polyimide precursor according to claim 1, obtained from a tetracarboxylic acid component having a light transmittance of 70% or more and a diamine component having a light transmittance of 30% or more, wherein the light transmittance of the tetracarboxylic acid component is a transmittance at a wavelength of 400 nm and an optical path length of 1 cm as a 10% by mass solution in a 2 N sodium hydroxide solution, and the light transmittance of the diamine component is a transmittance at a wavelength of 400 nm and an optical path length of 1 cm as a 8% by mass solution in methanol, water, N,N-dimethylacetamide or acetic acid or hydrochloric acid solutions thereof.

13. The polyimide precursor according to claim 1 having a light transmittance of 40% or more at a wavelength of 400 nm and an optical path length of 1 cm as a 10% by mass solution in a solvent selected from N,N-dimethylformamide, N,N-dimethylacetamide, N-methyl-2-pyrrolidone, N-ethyl-2-pyrrolidone, 1,3-dimethyl-2-imidazolidinone, dimethylsulfoxide and water.

14. A polyimide precursor solution composition comprising the polyimide precursor according to claim 1 dissolved in a solvent, wherein the solvent has a light transmittance of 89% or more at a wavelength of 400 nm and an optical path length of 1 cm.

15. A polyimide containing a repeating unit represented by the following chemical formula (5):

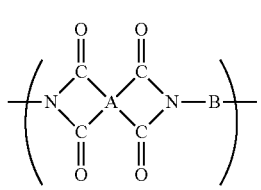

chemical formula (5)

wherein
A is a tetravalent group having a plurality of aliphatic six-membered rings and no aromatic ring in the chemical structure, with the proviso that the plurality of six-membered rings may have two common carbon atoms as constituents, and
B is at least one selected from the group consisting of the following chemical formulae (4-1) to (4-3):

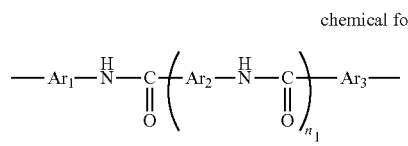

chemical formula (4-1)

wherein Ar$_1$, Ar$_2$ and Ar$_3$ are each independently a divalent group of benzene, biphenyl, terphenyl, naphthalene or anthracene, which may be substituted with C$_{1-3}$ alkyl group, halogen group, nitro group, hydroxyl group or carboxylic group, and n1 is an integer of 0 to 5;

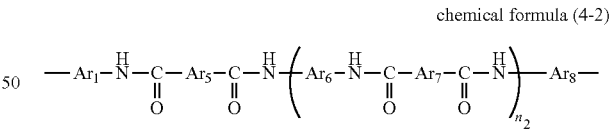

chemical formula (4-2)

wherein Ar$_4$, Ar$_5$, Ar$_6$, Ar$_7$ and Ar$_8$ are each independently a divalent group of benzene, biphenyl, terphenyl, naphthalene or anthracene, which may be substituted with C$_{1-3}$ alkyl group, halogen group, nitro group, hydroxyl group or carboxylic group, and n2 is an integer of 0 to 5;

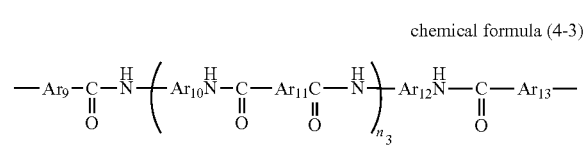

chemical formula (4-3)

wherein $Ar_9$, $Ar_{10}$, $Ar_{11}$, $Ar_{12}$ and $Ar_{13}$ are each independently a divalent group of benzene, biphenyl, terphenyl, naphthalene or anthracene, which may be substituted with $C_{1-3}$ alkyl group, halogen group, nitro group, hydroxyl group or carboxylic group, and n3 is an integer of 0 to 5; or B is a divalent group having at least one chemical structure represented by the following chemical formula (2) in the chemical structure:

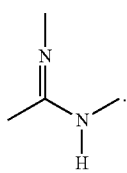

chemical formula (2)

16. The polyimide according to claim 15, wherein the six-membered rings in A have a crosslinked cyclic form, in which carbon atoms constituting the ring chemically bind to each other to form another ring.

17. The polyimide according to claim 15, wherein A is a group of the following chemical formula (3-2):

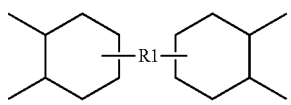

chemical formula (3-2)

wherein R1 is a direct bond, a $CH_2$ group, a $C(CH_3)_2$ group, an $SO_2$ group, an $Si(CH_3)_2$ group, a $C(CF_3)_2$ group, an oxygen atom or a sulfur atom.

18. The polyimide according to claim 15, wherein A is a group of the following chemical formula (3-4):

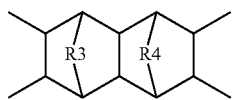

chemical formula (3-4)

wherein R3 and R4 are each independently a $CH_2$ group, a $CH_2CH_2$ group, an oxygen atom or a sulfur atom.

19. The polyimide according to claim 15, wherein B is at least one selected from the group consisting of the chemical formulae (4-1) to (4-3).

20. A polyimide obtained from the polyimide precursor according to claim 1.

21. The polyimide according to claim 15, wherein the total light transmittance (average transmittance of light having a wavelength 380 nm to 780 nm) of a film formed of the polyimide and having a thickness of 10 μm is 70% or more.

22. The polyimide according to claim 15, wherein the transmittance of light at a wavelength of 400 nm of a film formed of the polyimide and having a thickness of 10 μm is 50% or more.

23. The polyimide according to claim 15, wherein the average coefficient of linear thermal expansion from 50° C. to 200° C. of a film formed of the polyimide and having a thickness of 10 μm is 50 ppm/K or less.

24. The polyimide according to claim 15, wherein B in the chemical formula (5) is a divalent group having at least one chemical structure represented by the chemical formula (2) in the chemical structure; and the polyimide has an oxygen index of 22% (volume fraction) or more.

25. A substrate for a display, a touch panel or a solar battery formed of the polyimide according to claim 15.

26. A polyimide film/base material laminate comprising a polyimide film layer of the polyimide according to claim 15 on a base material.

27. The polyimide film/base material laminate according to claim 26, wherein the base material is at least one selected from the group consisting of ceramics, metals, and thermally-stable plastic films.

28. A flexible conductive substrate comprising a conductive layer of a conductive material formed on a polyimide film of the polyimide according to claim 15.

29. The flexible conductive substrate according to claim 28, wherein the conductive material is at least one selected from the group consisting of metals, metal oxides, conductive organic materials, and conductive carbon.

30. The flexible conductive substrate according to claim 28, wherein a gas-barrier layer and/or a light controlling layer is formed on the polyimide film surface.

31. A substrate comprising a circuit of a conductive layer on a surface of a polyimide film formed from the polyimide according to claim 15, optionally via a gas-barrier layer and/or an inorganic layer.

32. A flexible thin-film transistor comprising the substrate according to claim 31.

33. A liquid crystal device for a display device, EL device, or photoelectric device, comprising the substrate according to claim 31.

34. A process for producing a polyimide film/base material laminate or a polyimide film, comprising steps of:
    casting a polyimide precursor solution composition containing the polyimide precursor according to claim 1 and a solvent onto a base material;
    drying the composition to form a polyimide precursor film; and
    heating the polyimide precursor film at 350 to 500° C. for imidization on the base material, or in a state where the polyimide precursor film is peeled from the base material and fixed at the ends.

* * * * *

UNITED STATES PATENT AND TRADEMARK OFFICE
CERTIFICATE OF CORRECTION

PATENT NO. : 9,758,623 B2
APPLICATION NO. : 14/821380
DATED : September 12, 2017
INVENTOR(S) : Ryoichi Takasawa et al.

It is certified that error appears in the above-identified patent and that said Letters Patent is hereby corrected as shown below:

On the Title Page

Item (56), Column 2, Line 11, "Polymides" should be --Polyimides--.

Item (57), Abstract, Line 7, "six membered" should be --six-membered--.

Page 2, Item (56), Column 2, Line 19, "Polymides" should be --Polyimides--.

Page 2, Item (56), Column 2, Line 22, "correspnoding" should be --corresponding--.

In the Specification

Column 1, Line 65, "α,α-" should be --α,α'- --.

Column 5, Line 29, "8" should be --8.--.

Column 5, Line 36, "2 N" should be --2N--.

Column 9, Line 38-39, "dimethano naphthalene" should be --dimethanonaphthalene--.

Column 9, Line 42-43, "dimethano naphthalene" should be --dimethanonaphthalene--.

Column 11, Line 45, "(4.3)" should be --(4-3)--.

Column 11, Line 63, "(4.1)" should be --(4-1)--.

Column 12, Line 20, "phenylenebis (p-" should be --phenylenebis(p- --.

Column 12, Line 22-23, "terephthalamid" should be --terephthalamide--.

Signed and Sealed this
Thirty-first Day of July, 2018

Andrei Iancu
*Director of the United States Patent and Trademark Office*

CERTIFICATE OF CORRECTION (continued)
U.S. Pat. No. 9,758,623 B2

Column 12, Line 23, "phenylenebis (p-" should be --phenylenebis(p- --.

Column 12, Line 24, "terephthalamid" should be --terephthalamide--.

Column 12, Line 25, "phenylenebis (p-" should be --phenylenebis(p- --.

Column 17, Line 9 (Approx.), "sililating" should be --silylating--.

Column 18, Line 38, "sililating" should be --silylating--.

Column 18, Line 39, ""sililated" should be --silylated--.

Column 18, Line 39, "sililated" should be --silylated--.

Column 18, Line 40, "sililated" should be --silylated--.

Column 18, Line 51, "sililating" should be --silylating--.

Column 18, Line 58, "sililating" should be --silylating--.

Column 18, Line 60, "sililating" should be --silylating--.

Column 18, Line 67, "sililating" should be --silylating--.

Column 19, Line 3, "sililating" should be --silylating--.

Column 19, Line 5, "sililated" should be --silylated--.

Column 24, Line 14, "(2 N" should be --(2N--.

Column 26, Line 14, "bis (4-" should be --bis(4- --.

Column 26, Line 17, "diamine" should be --diamine;--.

Column 26, Line 22, "bis (4-" should be --bis(4- --.

Column 26, Line 37-38, "dimethano naphthalene" should be --dimethanonaphthalene--.

Column 26, Line 40-41, "dimethano naphthalene" should be --dimethanonaphthalene--.

Column 33-34, Line 2 (Table 4-2), "Cornp." should be --Comp.--.

Column 35-36, Line 2 (Table 4-2 continued), "Cornp." should be --Comp.--.

Column 35, Line 26, "bonds)" should be --bond(s)--.

CERTIFICATE OF CORRECTION (continued)
U.S. Pat. No. 9,758,623 B2

In the Claims

Column 39, Line 56-64 (Claim 1), "  "

should be -- 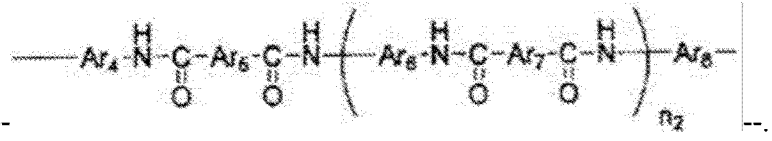 --.

Column 41, Line 59, "2 N" should be --2N--.

Column 42, Line 46-53 (Claim 15), " 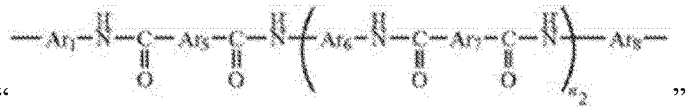 "

should be -- 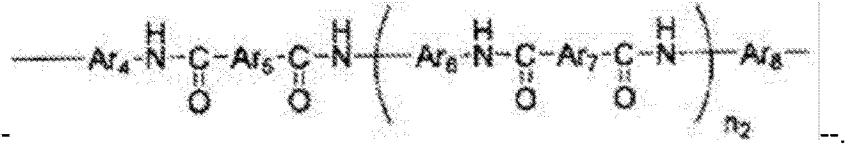 --.